US008306668B2

(12) United States Patent
Tamarkin et al.

(10) Patent No.: US 8,306,668 B2
(45) Date of Patent: *Nov. 6, 2012

(54) INTEGRATED METROLOGY SYSTEMS AND INFORMATION AND CONTROL APPARATUS FOR INTERACTION WITH INTEGRATED METROLOGY SYSTEMS

(75) Inventors: Tomer D. Tamarkin, Carmichael, CA (US); Robert S. Block, Reno, NV (US); Phillip M. Fine, Sacramento, CA (US)

(73) Assignee: USCL Corporation, Carmichael, CA (US)

( * ) Notice: Subject to any disclaimer, the term of this patent is extended or adjusted under 35 U.S.C. 154(b) by 151 days.

This patent is subject to a terminal disclaimer.

(21) Appl. No.: 12/126,998

(22) Filed: May 26, 2008

(65) Prior Publication Data
US 2009/0109056 A1    Apr. 30, 2009

Related U.S. Application Data

(63) Continuation of application No. 11/194,774, filed on Aug. 2, 2005, now Pat. No. 7,379,791.

(60) Provisional application No. 60/598,755, filed on Aug. 3, 2004.

(51) Int. Cl.
*G06F 19/00* (2006.01)
*G01D 4/00* (2006.01)

(52) U.S. Cl. ............................ 700/286; 705/412; 702/62

(58) Field of Classification Search .................. 700/286; 705/412; 702/61, 62; 340/870.02, 870.05, 340/870.09
See application file for complete search history.

(56) References Cited

U.S. PATENT DOCUMENTS

| 4,803,632 | A  | 2/1989  | Frew et al.  |
| 5,974,369 | A  | 10/1999 | Radtke et al. |
| 6,133,850 | A  | 10/2000 | Moore        |
| 6,529,883 | B1 | 3/2003  | Yee et al.   |

(Continued)

FOREIGN PATENT DOCUMENTS
DE          10210788 A1       9/2003

OTHER PUBLICATIONS

Japanese Patent Office International Search Report for PCT/US2005/027761, mailed Feb. 12, 2005.

(Continued)

*Primary Examiner* — John R. Cottingham
*Assistant Examiner* — Steven Garland
(74) *Attorney, Agent, or Firm* — Sterne, Kessler, Goldstein & Fox PLLC

(57) ABSTRACT

A system is disposed at a location of a utility commodity subscriber for informing the subscriber of and controlling utility commodity usage. The system includes utility meters, an information and control apparatus, and a first and second data communication link. The meters measure usage and generate usage signals. The information and control apparatus includes a microprocessor, a memory, a clock, and a user interface. The first data communication link is between the utility meters and the information and control apparatus, and the second data communication link is between the information and control apparatus and one or more central locations. The second communication link also provides rate information to the information and control apparatus and utility commodity usage data to the one or more central locations. The microprocessor computes an accumulated cost of utility commodity for a predetermined period of time. Information related to the accumulated cost is output to the subscriber.

9 Claims, 15 Drawing Sheets

U.S. PATENT DOCUMENTS

| | | |
|---|---|---|
| 6,734,806 B1 | 5/2004 | Cratsley, III |
| 7,039,532 B2 | 5/2006 | Hunter |
| 7,049,976 B2 | 5/2006 | Hunt et al. |
| 7,379,791 B2 * | 5/2008 | Tamarkin et al. ............ 700/286 |
| 2002/0040355 A1 | 4/2002 | Weiner |
| 2002/0120569 A1 * | 8/2002 | Day ................................ 705/40 |
| 2004/0024483 A1 | 2/2004 | Holcombe |
| 2004/0059585 A1 | 3/2004 | Villicana et al. |
| 2004/0078154 A1 | 4/2004 | Hunter |
| 2004/0113810 A1 | 6/2004 | Mason, Jr. et al. |
| 2005/0065742 A1 | 3/2005 | Rodgers |
| 2005/0190074 A1 | 9/2005 | Cumeralto et al. |

OTHER PUBLICATIONS

The Patent Office of the State Intellectual Property Office of the People's Republic of China; The First Office Action in Chinese Patent Application No. 200580033605.X mailed Jul. 18, 2008.

* cited by examiner

```
   Electric  Budget
Billing  Start  Day  0
Rate  Type  =  Time  of  Use
Daily  Budget      [2.40] $
Monthly  Budget      24 $
Alarm  on              0 %

12:33:37   AM   *   2 January 2000
```

```
    Electric Rates
First day of billing month 0
 Rate Type    1 = Fixed
              2 = Tiered
              3 = CPP
   -          4 = TOU Tier 1 Rate 0.10000 $/KWh
        Top      100 KWh
 Tier 2 Rate 0.15000 $/KWh
        Top      200 KWh
 Tier 3 Rate 0.40000 $/KWh 1:21:30  AM  *  2 January 2000
```

FIG. 14

```
    Electric Rates
First day of billing month 0
 Rate Type    1 = Fixed
              2 = Tiered
              3 = CPP
              4 = TOU

-

1:33:13  AM  *  2 January 2000
```

FIG. 15

The protocol for sending an SMS message is:

AT+CMGS=<number><CR><message><Ctrl-Z>

In order for the EMS2020 to track clock set messages, it will format the message shown below where the placeholders ### can contain a value of 001 to 256.

AT+CMGS="19167699527"<CR>ClockSet001<Ctrl-Z>

The communications protocol below illustrates how the resulting messages are retrieved once they are received.

+CMTI: "SM", 1              // New message indication "SM" is the memory type (SIM) and
1 is the memory cell $$ AT+CMGL="ALL"            // List all messages +CMGL: 1,"REC UNREAD","+9167699527",,"04/04/22,09:28:15+12"    //Message header ClockSet001            // Message content

OK $$ AT+CMGD=1             // Delete message cell 1

"Modulo 80" Conversion

To convert number to array of bytes in "Modulo 80" type of length 'Length' (message should contain characters with that ASCII values) use these VB functions:

```
Private Sub Modulo80(ByVal NumberToConvert As Long, _
    ByVal Length As Integer, arrModulo80() As Byte)

ReDim arrModulo80(Length)
Dim i As Integer
Dim tmpByte As Byte

For i = 0 To Length    ' LSB first
    tmpByte = NumberToConvert Mod 80
    arrModulo80(i) = SMS_ASCII_Num(tmpByte)    ' Use only valid characters
    NumberToConvert = NumberToConvert \ 80     ' "\" = Div
Next
End Sub Public Function SMS_ASCII_Num(ByVal byteToChange As Byte) As Byte byteToChange = byteToChange + &H20
If byteToChange > &H5A And byteToChange < &H61 Then
    byteToChange = byteToChange + (&H71 - &H5B)
End If
SMS_ASCII_Num = byteToChange End Function
```

FIG. 18

Check sum calculation

The check sum may consists of two bytes calculated by this function:

```
Public Sub SMSChksum(ByVal strMsg as Sting, _
      byte1 As Byte, byte2 As Byte)

Dim Num As Integer
  Dim ChkSum As Integer
  Dim msgLen As Integer
  Dim i As Integer msgLen = Len(strMsg)-2      ' Assuming two characters for checksum
                              ' already allocated
  For i = 1 To msgLen
    ChkSum = ChkSum + Asc(Mid$(strMsg, i))
  Next
  ChkSum = (Not ChkSum)

byte1 = ShiftRight(ChkSum And 255, 2)
  byte1 = SMS_ASCII_Num(byte1)

byte2 = ShiftRight(ChkSum, 10)
  byte2 = SMS_ASCII_Num(byte2)
End Function

Function ShiftRight(ByVal Value As Integer, ByVal times As Integer) _
      As Integer
    Dim mask As Long, signBit As Long ' return zero if too many times
    If times >= 16 Then Exit Function ' return the value if zero times
    If times = 0 Then ShiftRight = Value: Exit Function ' evaluate the sign bit in advance
    signBit = (Value < 0) And Power2(15 - times)
    ' create a mask with 1's for the digits that will be preserved
    If times < 15 Then
        ' if times=15 then the mask is zero
        mask = Not (Power2(times) - 1)
    End If
    ' clear all the digits that will be discarded, and
    ' also clear the sign bit
    Value = (Value And &H7FFF) And mask
    ' do the shift, without any problem, and add the sign bit
    ShiftRight = (Value \ Power2(times)) Or signBit End Function
```

FIG. 19

INTEGRATED METROLOGY SYSTEMS AND INFORMATION AND CONTROL APPARATUS FOR INTERACTION WITH INTEGRATED METROLOGY SYSTEMS

This application is a continuation of U.S. patent application Ser. No. 11/194,774, filed Aug. 2, 2005, which claims the benefit of U.S. Provisional Patent Application No. 60/598,755, filed Aug. 3, 2004; the disclosures of which are incorporated herein by reference.

BACKGROUND OF THE INVENTION

1. Field of the Invention

The present invention relates to integrated metrology systems comprising at least one utility meter, an information and control apparatus, a first data communication link, and a second data communication link. Further, the invention relates to information and control apparatus comprising an information and control panel and an interface for interaction with integrated metrology systems. Such systems and apparatus allow subscribers to budget, monitor, and manage their expenditures for utility commodities and to control their use of utility commodities through local or remote interfaces.

2. Description of Related Art

As utility commodity (e.g., natural gas, propane, heating oil, electricity, water, sewer, and the like) prices rise, increasing numbers of utility commodity user (hereinafter "subscribers") search for ways to budget, monitor, and control the amount of money spent on such utility commodities. A fundamental problem faced by utility commodity uses in controlling their use of such utility commodities is that it is difficult to determine accurately and efficiently how much of each utility commodity the subscriber has used and is using and, therefore, how much the subscriber has spent and is spending on utility commodities at any point in time. Further, because utility commodity rates may vary over time and by time of use, subscribers may not know how much it costs to operate a given appliance, maintain a certain household temperature, water the lawn, or the like.

Utility commodity suppliers (e.g., public utility companies) also are largely unable to determine how much of a utility commodity a subscriber is using at any point in time. Such utility commodity suppliers largely are unable to determine what the maximum or peak amount of a utility commodity has been or is being used by an individual subscriber nor are they able to develop a correlation between time of utility commodity use or the amount used. The overwhelming majority of residential subscribers' accounts are billed by taking an accumulation of utility commodity use over a billing (e.g., a thirty-day) period of time. As a result of these metering limitations, subscribers may not receive or may not be able to receive the benefit of flexible pricing options that more closely match their individual usage profiles.

In addition, a utility commodity supplier frequently obtains these accumulated monthly readings by sending a meter reader to each and every subscriber's address to manually (e.g., visually) inspect a local utility meter and to manually record readings, for example, in any of a variety of known, hand-held data terminals (e.g., mobile meter readers (MMR)). Many subscribers' addresses receive multiple metered utility commodities, for which each of the local utility meters may be read once each billing period (e.g., once-a-month) by a different utility meter reader representing one of the utility commodity suppliers. This practice represents a significant cost in time and personnel to the utility commodity suppliers and, ultimately, to the subscribers.

Moreover, because the utility meter readers often must enter the subscriber's property to read the utility meter, such practices also raise non-trivial, liability issues for the utility commodity suppliers and security issues for the subscribers.

Automatic utility meters, which permit the collection, calculation, storage, and display of data indicative of utility commodity usage are known. In addition, such automatic utility meters may include communication devices which permit bi-directional communication of data to and from a remote computer. Such automatic utility meters are direct replacements for existing utility meters, and such automatic electric utility meters may use direct read circuitry to sample and calculate power directly from an input voltage and current waveforms received from an electricity provider. U.S. Pat. No. 5,994,892, the disclosure of which is incorporated herein by reference, describes this basic metrology and adds to it the capability of communications with an external device, such as a computer.

SUMMARY OF THE INVENTION

Advances in microelectronics and communications technology render known practices for utility metering, utility meter reading, and subscriber billing obsolete. It now is possible to provide the subscriber up-to-the-second, real-time and accumulated energy usage and pricing information, to provide means to control such usage, and to automatically transfer this information to multiple utility commodity suppliers. The same technology provides the utility commodity suppliers significant positive economic advantages based on new control ability, reduced operating expenses, and new revenue streams resulting from new value added products and services. Further, new financing alternatives may be created which reduce or eliminate the necessity of the utility commodity supplier having to pay for the acquisition costs associated with the new metering equipment. Use of this technology may allow utility commodity suppliers to reduce costs and increase efficiency, thereby, enhancing profitability, in the delivery of utility commodities to subscribers.

Accordingly, a need has arisen for a system at a location of a utility commodity subscriber for informing the subscriber of utility commodity cost and usage and for controlling utility commodity usage, including an interface between a utility meter and a wide area network, such as the Internet, whereby, customer service messaging, emergency notification, and homeland security messaging, emergency utility commodity disconnect in the event of natural or man made disasters, and service personnel database update and report transmittals are possible. The utility meter may comprise an electricity meter, a water meter, a gas meter, an oil tank level sensor, a propane tank level sensor, a thermostat, a temperature sensor, a relative humidity sensor; an appliance power sensor, and the like and combinations thereof. It is a feature of such a system that each utility meter has sufficient, non-interruptible power to allow for the transmittal of service outage conditions, including time stamping and the meter identification number reporting, to the utility commodity supplier. Further, it is a feature of such systems that upon service restoration, each utility meter may transmit a time-stamped notification of the service restoration event along with the meter identification number to the utility commodity supplier. It is another feature of such a system that revenue diversion events and activities of, such as the shunting, bypassing of, or tampering with a utility meter may be time-stamped and transmitted to the utility commodity supplier.

A need also has arisen for a system including a utility meter or meters adapted to facilitate remote utility commodity supply connection and disconnection. It is a feature of such systems that each meter may support the optional internal mounting and connection of a 2-pole, 100-ampere relay or contactor. Such meters may include an integrated electronic interface to such a relay and embedded firmware to allow the relay to be switched from state-to-state (e.g., connected or disconnected) from a central location (e.g., an electric utility company or a natural gas supplier) through communications over a wide area network. It is an advantage of such meters that the associated electronics and control firmware may be adapted to support various prepayment options, including on-site, smart card payment or activation or over-the-network activation, as well as class of service change or changes to maximum load thresholds before automatic shutoff of utility commodity supply. A "smart card" is a credit or debit card with a built-in microprocessor and memory used for identification or financial transactions. When inserted into a reader, the smart card transfers data, usually via a wide area network (WAN), to and from a central computer. A WAN is a computer network that spans a relatively large geographical area and may comprise two or more local area networks (LANs). Devices are connected to a WAN through public networks, such as telephone networks and power lines. Devices also may be connected to a WAN through private networks, such as satellite networks or cable TV networks. Generally, smart cards are more secure than a magnetic stripe card and may be programmed to self-destruct if the wrong password is entered too many times. As a financial transaction card, a smart card may be loaded with digital money and used like a traveler's check, except that variable amounts of money may be spent until the balance is zero. Additionally—and as a safety precaution, it is an advantage of such meters that an external control button may be provided for final account activation by the subscriber prior to power restoration by the relay. This control may be mounted on the utility meter with external access, or it may be incorporated into an information and control apparatus.

A further need has arisen for a system including means for over-voltage and under-voltage reporting. It is a feature of such systems that each electrical meter may record and store automatically for at least about forty (40) days the maximum and minimum voltage over a 500-millisecond period in each interval time "bin." Further, it is another feature of such systems that the embedded firmware of the utility meter may trigger the transmittal of a time-stamped notification to the central location in the event of a sustained over-voltage or under-voltage in excess of a predetermined threshold for a predetermined period. It is a preferred feature of such systems that the meters may monitor each leg of the incoming circuit with respect to neutral as a function of the sinusoidal waveform phase relationship and distortion monitoring.

Yet another need has arisen for a system including means for power factor monitoring and reporting. It is a feature of such systems that each electrical meter may be adapted to monitor the power factor or quality of each of the circuit lines with respect to the zero cross-point, to record statistically significant deviations for each interval time bin, and to generate a time-stamped transmittal of power factor data in the event predetermined thresholds of uncorrected, power factor conditions occur. It is also a feature of such electrical meters, that through digital signature analysis, the meter may be adapted to differentiate between distribution system related load factors creating power factor changes and subscriber's load conditions creating power factor changes. The first set of information is of use to the central location for distribution system performance monitoring and optimization, and the second set of data is of relevance to the subscriber for preventative maintenance. The data further may be used as billing determinates in "class of service" rate structures in which power factor is included.

Yet a further need has arisen for a system including a LAN node or gateway. It is a feature of such systems that the meter may be the principal node or gateway in a subscriber's wireless LAN, such that the meter may receive data from and transmit data to other utility meters. In addition, the subscriber's LAN gateway may be an interface to a subscriber's information and control apparatus, as well as an in-home appliance and load monitoring and control network. It is an advantage of such meters that they may include sufficient data logging and processing hardware and embedded firmware to allow for the implementation of the same type of variable rate structures described above with respect to electrical utility commodity service, for gas and water utility commodity service. While the need for this capability may not be immediately apparent, this feature enables variable rate implementation, such as time-of-use (TOU), peak demand, day-of-use, rate structures, for gas and water utility commodity services.

Implementation of such variable rate structures for water and natural gas or propane utility commodity service offers manifold benefits to subscribers, the respective utility commodity suppliers and most of all, the electrical utility commodity supplier, because both gas and water use significant amounts of electricity to pump the utility commodity through their distribution systems, and because this use of electricity frequently runs parallel to the critical peak demand. Further, the cost of both water and gas recently has been escalating, and many areas face peak demand limitations on both utility commodities.

Still another need has arisen for a system adapted for remote programming. It is a feature of utility meters of such systems that they may be adapted to be remotely programmed and that the utility meter's embedded firmware comprising a real-time run system may be adapted to download future updates over a WAN to insure that future enhancements and upgrades may be cost effectively implemented.

Yet another need has arisen for a system adapted to be responsive to product life cycle, mean time between failures (MTBF), and environmental considerations. It is a feature of such systems that the utility meters may be constructed to ensure a 20-year life cycle, a MTBF consistent with known electromechanical utility meters, and continuous operation at temperatures ranging between about −40° C. and about +85° C. Preferably, the electronic and mechanical components may allow for extended operation in sea coast areas with relatively high air concentrations of sodium chloride and other salts and may be immune from transient power events consistent with ANSI C-12.11, which standard is incorporated herein by reference, and other relevant specifications.

Still yet another need has arisen for a system comprising a subscriber information and control apparatus to visually or audibly display system information to the subscriber and to receive the subscribers operational control input. It is a feature of such systems that they may comprise a wireless, in-home graphic user interface (GUI) or other information and control panel, which may be included with each advanced integrated metrology (AIM) unit in order to enable the use of most of the above features described above. Communications between this apparatus and the utility meter or meters preferably are wireless, as opposed to, for example, power line carrier, in order to allow for the portability of the apparatus. Thus, the apparatus may be adapted for use as an audit and conservation management tool. It is further preferred that the apparatus is sufficiently large to provide a full color display, so as to convey clearly the largest possible amount of information to the subscriber. The screen displays may be nested in complexity to allow for the apparatus to be used by a broad spectrum of subscribers with different educational backgrounds, socio-economic backgrounds, interests levels, and levels of patience. For example, it is an advantage of such apparatus that display screens may be as simple as a blank screen that varies in color indicating either cost information or usage information. Alternatively, display screens such may be quite complex providing significant amounts of information to those interested. Preferably, display screen graphics are entertaining or educational, or both, as well.

The subscriber information and control apparatus may comprise hardware or software, or both, to accomplish a variety of support features, including, but not limited to, the subscriber's interface with "smart home" appliances through the use of the wireless LAN and remote appliance modules, which both may monitor the specific load of the appliance, as well as modulate that load under the command of the subscriber or the utility commodity supplier or under the terms of a preferred rate structure allowing remote access to loads by the utility. The information and control apparatus also may be a subscriber's computer, such as a desktop or laptop computer, a personal digital assistant, or the like, comprising hardware or software, or both, to accomplish the described functions. A network node connection also may be established to a subscriber's home computer through a "plug-and-play" radio-frequency (RF) to universal service bus (USB) interface. Prepayment of utility commodity charges and the connection of utility commodity services may be accomplished over a WAN. As noted above, such prepayment of utility commodity charges may be accomplished through the use of a subscriber inserted smart card programmed at an authorized utility charging location or payment station in the subscriber's information and control apparatus. In both prepayment instances, the subscriber and utility commodity supplier may enjoy the benefits of the advanced AIM unit features, including remote data access and complex rate structures, while the utility commodity supplier also may enjoy the benefit of enhanced cash-flow, reduced collection activities, and an overall reduction of liabilities relating to subscriber-site visits. The utility commodity supplier may use the GUI to display messages created by its subscriber service department or other departments as well as emergency notification messages. Further, the utility commodity supplier may partner with local businesses to offer the messaging service as a distinctive, subscriber addressable, advertising and messaging service to those subscribers who choose to enable this function. Moreover, the utility commodity supplier may partner with local businesses and use the subscriber information and control apparatus to deliver electronic advertisements or coupons to the same smart card which coupons, in some instances, may be used for those subscribers who prefer to take advantage of a prepayment program.

In an embodiment, a system, according to this invention, is at a location of a utility commodity subscriber and informs the subscriber of utility commodity cost and usage, so that the subscriber may control utility commodity usage. A utility commodity may include electricity, natural gas or propane, potable and sewer water, heating oil, or the like. The system may comprise at least one utility meter, an information and control apparatus, a first data communication link (e.g., a wireless link) between the at least one utility meter and the information and control apparatus, and a second data communication link between the information and control apparatus and at least one central location associated with the at least one utility commodity. The at least one utility meter measures usage of at least one utility commodity and generates at least one usage signal comprising a measurement of the subscriber's usage of the at least one utility commodity. The information and control apparatus comprises a microprocessor, a memory, a clock, and a user interface, for inputting and outputting information. In addition, the information and control apparatus may be separable into an information and control panel and an interface. The user interface may comprise a keyboard; an operatively-grouped array of buttons; an light pen; a touch screen; a microphone and voice recognition software, firmware, or hardware; and combinations thereof and the like. The first data communication link provides the at least one usage signal to the information and control apparatus for storage in the memory. The second data communication link provides rate information related to usage of the at least one utility commodity from the at least one central location to the information and control apparatus and provides utility commodity usage data from the information and control apparatus to the at least one central location. Further, the microprocessor computes an accumulated cost of the at least one utility commodity for a predetermined period of time according to the clock, the at least one usage signal, and the rate information, and wherein information related to the accumulated cost is provided to the user interface for output to the subscriber. Further, the microprocessor also may compute the accumulated cost of the at least one utility commodity for a predetermined billing period.

In this system, the information and control apparatus may regulate operation of at least one device which uses the at least one utility commodity in response to a differential between the rate and a rate value input by the subscriber. Alternatively, the information and control apparatus may regulate at least one device which uses the at least one utility commodity in response a differential between the accumulated cost and an accumulated cost value input by the subscriber. The system further may comprise an audible alarm for notifying the subscriber in real-time if the accumulated cost is at or within a predetermined value approaching the accumulated cost value input by the subscriber.

The user interface may comprises a visual display, on which the rate and the accumulated cost value are displayed visually in response to a request from the subscriber. The visual display also may be a combined audio-visual display and may comprise a Liquid crystal display (LCD), a light-emitting diode (LED) display, a cathode ray tube (CRT) display, a Plasma display screen, or the like.

In another embodiment, a system for display at a subscriber's location, is at a subscriber's location of utility commodity cost and usage data and for local or remote control of utility commodity usage comprises at least one meter for measuring usage of at least one utility commodity and for generating at least one usage signal comprising a measurement of the subscriber's usage of the at least one utility commodity; at least one central location for receiving the subscriber's utility commodity usage data and a utility commodity cost for the subscriber and transmitting at least one utility commodity rate and utility commodity usage control signals to an information and control apparatus at the subscriber's location; and the information and control apparatus. The information and control apparatus comprises a microprocessor; a memory; a display; a user interface; a clock; and display communication means for receiving the at least one utility commodity rate and the utility commodity usage control signals from the at least one central location, for receiving at least one usage signal from the at least one meter, and for transmitting the subscriber's utility commodity usage and cost data to the at least one central location. Each of the at least one meter further comprises meter communication means for transmitting the at least one usage signal to the information and control apparatus, and each of the at least one central locations further comprises center communication means for transmitting utility commodity rates and utility commodity usage control signals to the information and control apparatus and for receiving the subscriber's utility commodity usage data from the information and control apparatus.

The display communication means are connected operably to the memory, such that the memory receives and stores the at least one utility commodity rate delivered via the display communication means. The memory is connected operably to the microprocessor, such that the utility commodity usage and cost data generated by the microprocessor is received and stored by the memory. The display is connected operably to the microprocessor and the memory, such that the display selectively displays the utility commodity usage and cost data generated by the microprocessor or stored in the memory; and the user interface is connected operably to the microprocessor, such that the microprocessor receives subscriber control signals. The display may be selected from the group consisting of a visual display, an audio display, and a combined audio-visual display. In addition, the display communication means may receive the at least one utility commodity rate and utility commodity usage control signals and transmit the subscriber's utility commodity usage data via a WAN. Alternatively, the display communication means may receive the at least one usage signal from the at least one meter via a LAN.

The information and control apparatus may be adapted to calculate and display utility commodity usage data accumulated over at least one first predetermined period and utility commodity cost data accumulated over at least one second predetermined period; wherein the at least one first predetermined period is equal to or less than the at least one second predetermined period. The memory of the information and control apparatus may adapted to store the display utility commodity usage data accumulated over at least one first predetermined period and the utility commodity usage data accumulated over at least one second predetermined period in the memory. Moreover, the information and control apparatus is adapted to display the at least one utility commodity rate which is applicable at a predetermined time. The utility commodity rate may be fixed or variable. If variable, the utility commodity rate may be determined by TOU, Tiered accumulated use, peak demand, dynamic pricing, real-time pricing, or the like.

The display communication means may be a transceiver, and the meter communication means also may be a transceiver. Thus, the information and control apparatus and the at least one utility meter communicate wirelessly. Similarly, the display communication means may be a transceiver, and the center communication means may be a transceiver, such that the information and control apparatus and the at least one central location also may communicate wirelessly. Alternatively, each of the display communication means and the meter communication means may comprise a modem and may be connected to a LAN, such that the information and control apparatus and the at least one utility commodity meter communicate via the LAN. Moreover, each of the display communication means and the center communication means may comprise a modem and may be connected to a WAN, such that the information and control apparatus and the at least one central location communicate via the WAN. The WAN may comprise a wireless WAN, which may link with various LANs and wireless LANs, using, for example, IEEE 802.11 (WIFI for LAN) or IEEE 802.15.4 (ZigBee for LAN) and TCP/IP protocols.

Each of the display communication means and the center communication means also may comprise a modem and may be connected to a telephone network, and the information and control apparatus and the at least one central location may communicate via the telephone network. A telephone network may include a land-line telephone network, a cellular telephone network, or a combination thereof. Similarly, each of the display communication means and the center communication means may comprise a power line carrier modulation transceiver connected to an electrical power line, and the information and control apparatus and the at least one central location may communicate via the electrical power line. In addition, each of the display communication means and the center communication means may comprise a cable modem connected to a cable television network, and the information and control apparatus and the at least one central location may communicate via the cable television network.

The at least one meter may be a thermostat for a heating, an air conditioning, or a combined heating, ventilation, and air conditioning (HVAC) unit, and the microprocessor may be adapted to compare the calculated utility commodity cost over the second predetermined period to a budgeted utility commodity cost for the second predetermined period and to generate a thermostat control signal. When a difference between the budgeted utility commodity cost and the calculated utility commodity cost is less than a predetermined cost differential, the display communication means may be adapted to transmit the thermostat control signal to the meter communications means (e.g., an RF transceiver) of the thermostat. The information and control apparatus may be linked to the thermostat over a LAN or the information and control apparatus may be combined with the thermostat.

In still another embodiment, a system for reporting at a subscriber's location of utility commodity cost and usage data and for local or remote control of utility commodity usage comprises at least one meter for measuring usage of at least one utility commodity and generating at least one usage signal comprising a measurement of the subscriber's usage of the at least one utility commodity; at least one central location for receiving the subscriber's utility commodity usage data and a utility commodity cost for the subscriber and transmitting at least one utility commodity rate and utility commodity usage control signals to an information and control apparatus at the subscriber's location; and an information and control apparatus. The information and control apparatus may comprise a microprocessor; a memory; a display; a user interface; a clock; and display communication means. The display communication means may receive utility commodity rates and utility commodity usage control signals from the at least one central location, receive at least one usage signal from the at least one meter, and transmit the subscriber's utility commodity usage data to the at least one central location. Each of the at least one meter further may comprise meter communication means for transmitting at least one usage signal to the information and control apparatus, and each of the at least one central location further may comprise center communication means for transmitting utility commodity rates and utility commodity usage control signals to the information and control apparatus and for receiving the subscriber's utility commodity usage data from the information and control apparatus. In addition, the at least one meter may measure a daily usage value of the utility commodity and an accumulated usage value over a predetermined billing period of time for transmission to the information and control apparatus. Moreover, the microprocessor may calculate a daily usage percentage of a budgeted daily usage value stored in the memory and a usage percentage of the predetermined billing period of a budgeted usage value for the predetermined billing period stored in the memory, or the microprocessor may calculate an average usage rate equal to the accumulated usage divided by the elapsed time of the predetermined billing period percentage.

The display may comprise a visual display adapted to depict at least four (4) bar graphs depicting the daily usage percentage, the usage percentage of the predetermined billing percentage, a daily elapsed time percentage, and an elapsed time of the predetermined billing period percentage. In addition, the display may comprise an audible alarm, which sounds when a accumulated usage differential between the accumulated usage value over a predetermined billing period of time and a budgeted usage value over a predetermined billing period of time stored in the memory is less than or equal to a predetermined accumulated warning differential. Alternatively, the display's audible alarm may sound when a daily usage differential between the daily usage value and a budgeted daily usage value stored in the memory is less than or equal to a predetermined daily warning differential.

In yet another embodiment, a meter-control system interface apparatus may comprise an interface memory for storing utility data received from at least one meter, the meter generating at least one usage signal comprising a measurement a subscriber's usage of at least one utility commodity; interface communications means for receiving at least one usage signal from at least one meter; and a microprocessor. The microprocessor may comprise a clock, which is connected operably to the interface memory and which determines time interval usage data for the at least one utility commodity based on the measurement received in the at least one usage signal for the at least one utility commodity received from the at least one meter and transmits the time interval usage data for storage in the interface memory. The system interface apparatus further may comprise a LAN operably connecting the interface communication means to the at least one meter.

In addition, the meter-control system interface apparatus may comprise at least one switching device operably connected to the interface communication means, and control signals generated by the interface microprocessor may be transmitted to the at least one switching device by the interface communications means via the LAN. Further, the at least meter may comprise an electrical meter and the at least one switching device modulates a flow of electricity to at least one electrical load. Moreover, the meter-control system interface apparatus further may comprise at least one subscriber utility supply controller operably connected to the interface communication means via the LAN, whereby the at least one subscriber utility supply controller modulates the supply of at least one utility commodity to the subscriber. Such a subscriber utility supply controller may comprise a electric relay or contractor, a water main supply valve, a gas shut off valve, or the like, or combinations thereof.

In still yet another embodiment, a system for display at a subscriber's location of utility commodity cost and usage data and for local or remote control of utility commodity usage may comprise at least one meter for measuring usage of at least one utility commodity and generating at least one usage signal comprising a measurement of the subscriber's usage of the at least one utility commodity; at least one central location for receiving the subscriber's utility commodity usage data and a utility commodity cost for the subscriber and transmitting at least one utility commodity rate and utility commodity usage control signals to an information and control apparatus at the subscriber's location; the information and control apparatus; a meter-control system interface apparatus; and a remote computer. The information and control apparatus may comprise a display microprocessor; a memory; a display; a user interface; a display clock; and display communication means. The display communication means may receive utility commodity rates and utility control signals from the at least one central location, receive at least one usage signal from the at least one meter, and transmit the subscriber's utility data to the at least one central location. The meter-control system interface apparatus may comprise an interface memory for storing utility data received from at least one meter, the meter generating at least one usage signal comprising a measurement a subscriber's usage of at least one utility commodity; interface communication means for receiving at least one usage signal from the at least one meter; and an interface microprocessor comprising an interface clock, which is linked to the interface memory and which determines time interval usage data for the at least one utility commodity calculated from the measurement received in the at least one usage signal for the at least one utility commodity received from the at least one meter and transmits the time interval usage data for storage in the interface memory. The remote computer may comprise remote communication means from transmitting polling signals to the meter-control system interface apparatus requesting download of the time interval usage data and to receive the time interval usage data transmitted by the interface communication means. Each of the at least one meters further may comprise meter communication means for transmitting at least one usage signal to the information and control apparatus, and each of the at least one central location further may comprise center communication means for transmitting utility commodity rates and utility commodity usage control signals to the information and control apparatus and for receiving the subscriber's utility commodity usage data from the information and control apparatus.

In a further embodiment, an information and control apparatus may comprise a microprocessor; a memory; a display; a user interface; a clock; and display communication means. The display communication means may receive utility commodity rates and utility control signals from at least one central location, receive at least one usage signal from at least one meter, and may transmit a subscriber's utility data to the at least one central location over a wide area network. The information and control apparatus further may comprise a data input port by which utility commodity usage payment information is uploaded to or downloaded from the at least one central location. For example, the data input port may be adapted to receive a smart card. Utility commodity usage information may comprise advertising, electronic coupons, loyalty and credit information, and prepaid, utility credits, and the like and combinations thereof.

The display communication means may be connected to the memory, such that the memory receives and stores the utility commodity rates delivered from the display communication means. The memory is connected to the microprocessor, such that the utility commodity usage and cost data generated by the microprocessor is received and stored by the memory. Further, the display may be connected to the microprocessor and the memory, such that the display selectively displays the utility commodity usage and cost data generated by the microprocessor or stored in the memory. Moreover, the user interface may be connected operably to the microprocessor, such that the microprocessor receives user control signals.

In addition, the information and control apparatus may comprise a speaker and means for decoding and amplifying digital audio data received by the display communication means via the wide area network. The digital audio data may be broadcast (annunciated) through a self-contained or an external speaker of speaker system and that the data may include emergency notification of conditions such as safety threats, severe weather conditions, homeland security issues and the like may be delivered to each subscriber over the wide area network twenty four hours a day, under the control of a remote computer.

Further objects, features, and advantages of the present invention will be understood from the following detailed description of preferred embodiments of the present invention with reference to the accompanying figures.

BRIEF DESCRIPTION OF THE DRAWINGS

Embodiments of the invention now are described with reference to the accompanying figures, which are given by way of example only, and are not intended to limit the present invention.

FIG. 14 depicts a subscriber's electric tiered rate dialog, screen display on the information and control apparatus, as depicted in FIG. 7.

FIG. 15 depicts a subscriber's electric time-of-use rate dialog, screen display on the information and control apparatus, as depicted in FIG. 7.

FIG. 17 depicts a subscriber's clock set communications protocol for the information and control apparatus, as depicted in FIG. 7.

FIG. 18 is a function for the conversion of a number into an array of bytes in Mondulo 80.

FIG. 19 is a function for calculating two (2) bytes as a checksum.

DETAILED DESCRIPTION OF PREFERRED EMBODIMENTS

Figure 1:
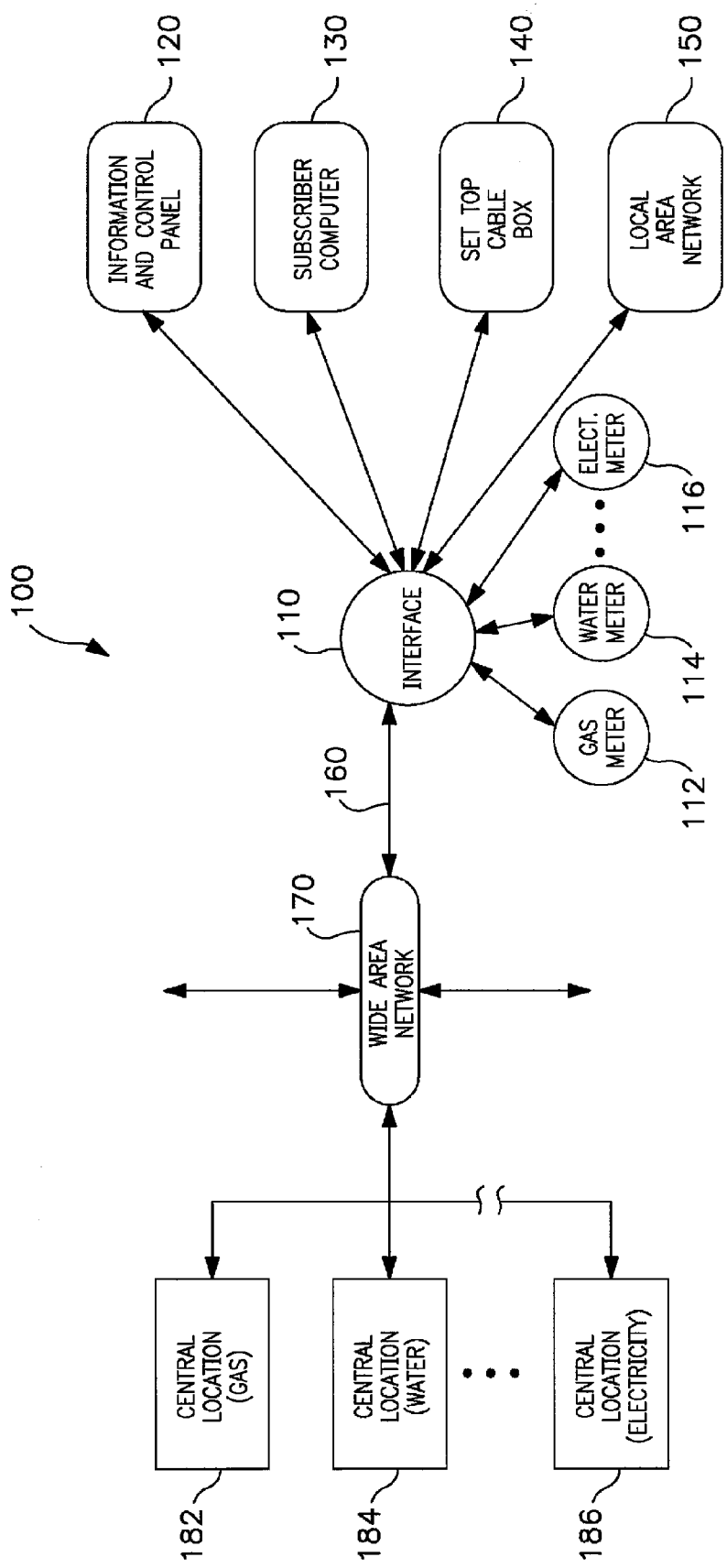
FIG. 1 is a schematic drawing of a system at a location of a utility commodity subscriber for informing the subscriber of utility commodity cost and usage and for controlling utility commodity usage.
Figure 1A:
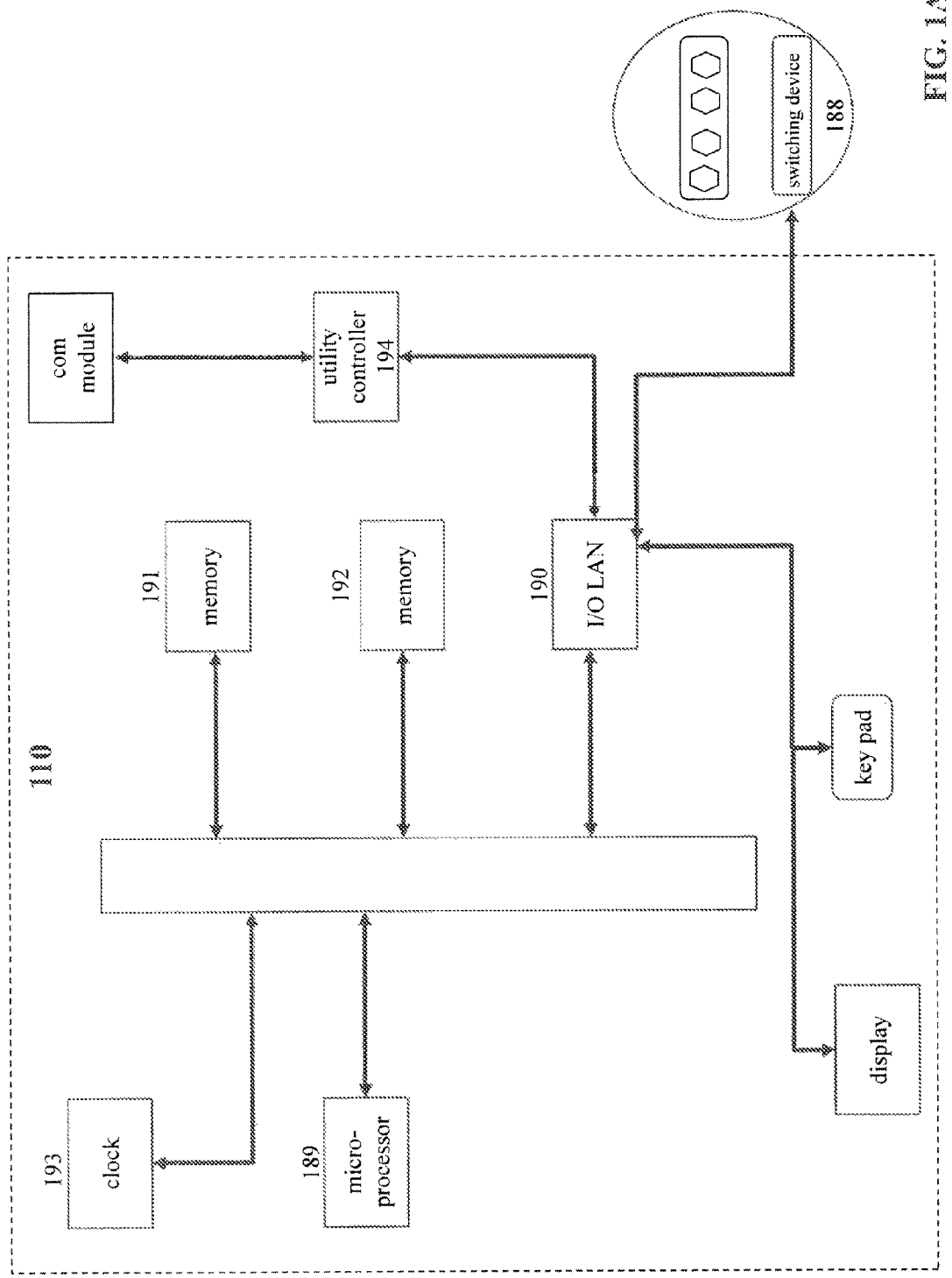
FIG. 1A is a block diagram illustration of interface 110 shown in FIG. 1.
Figure 2:
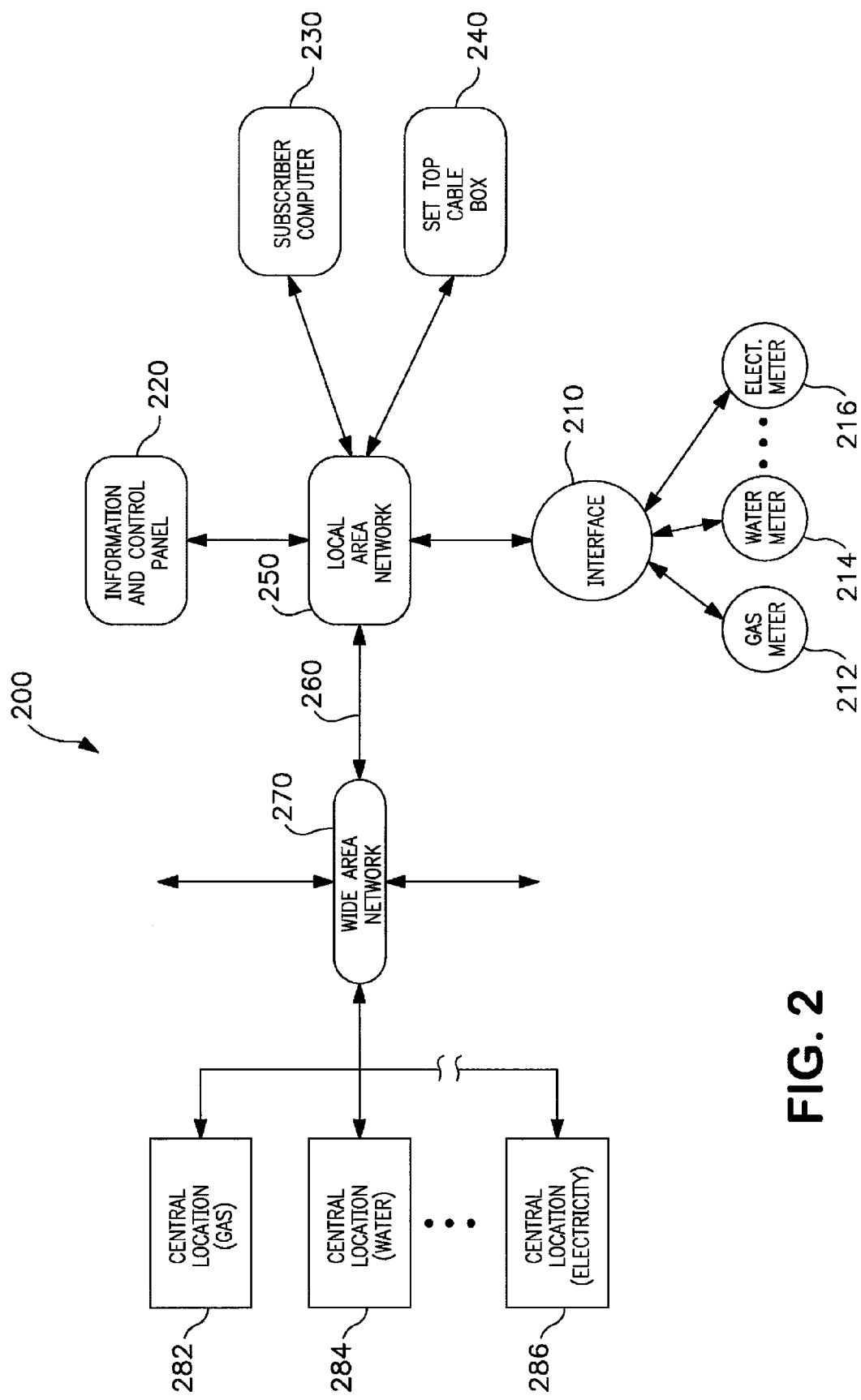
FIG. 2 is a schematic drawing of another system at a location of a utility commodity subscriber for informing the subscriber of utility commodity cost and usage and for controlling utility commodity usage.
Figure 3:
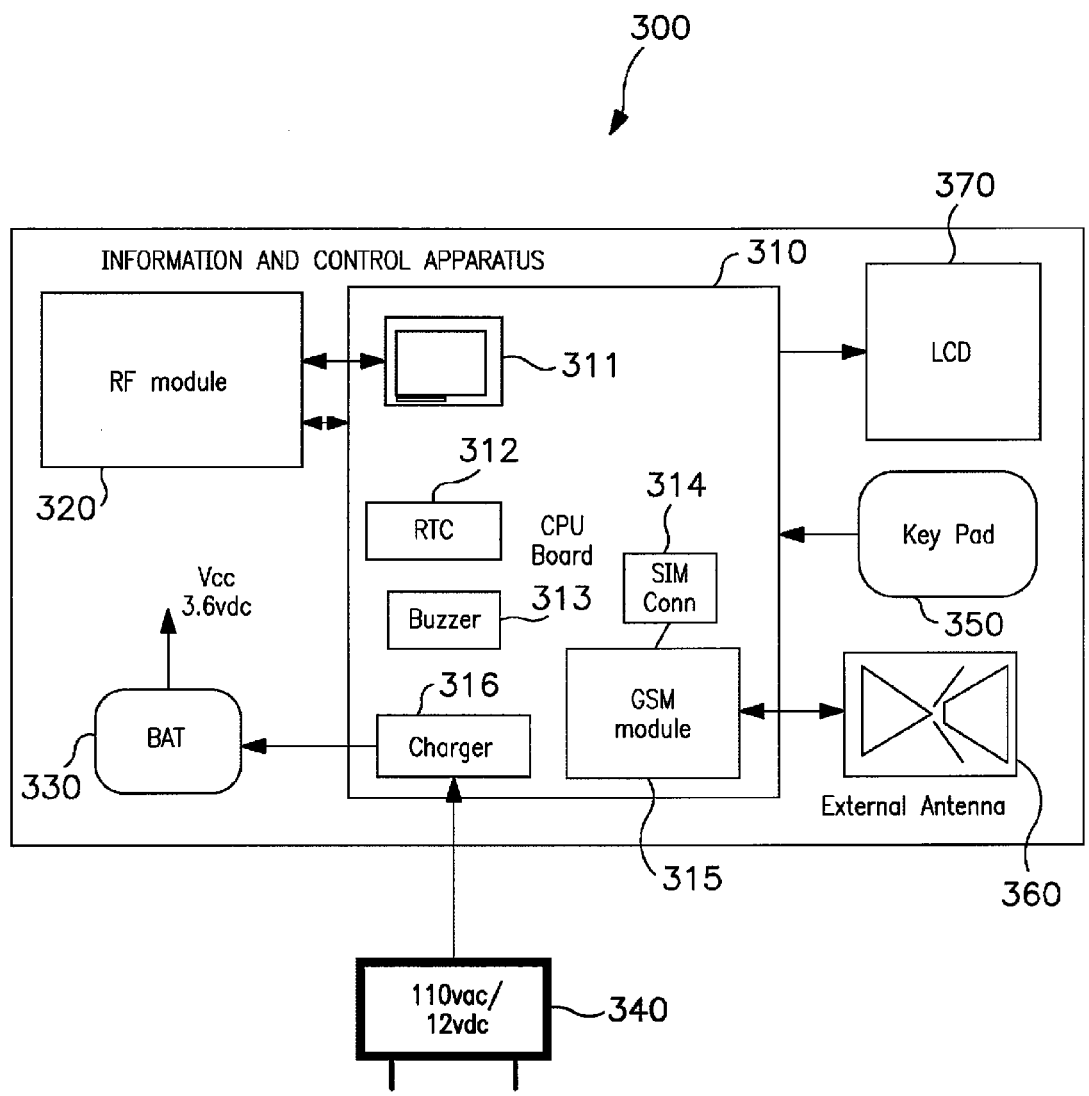
FIG. 3 is a schematic drawing of a information and control apparatus, suitable for use in the systems depicted in FIGS. 1 and 2.
Figure 4:
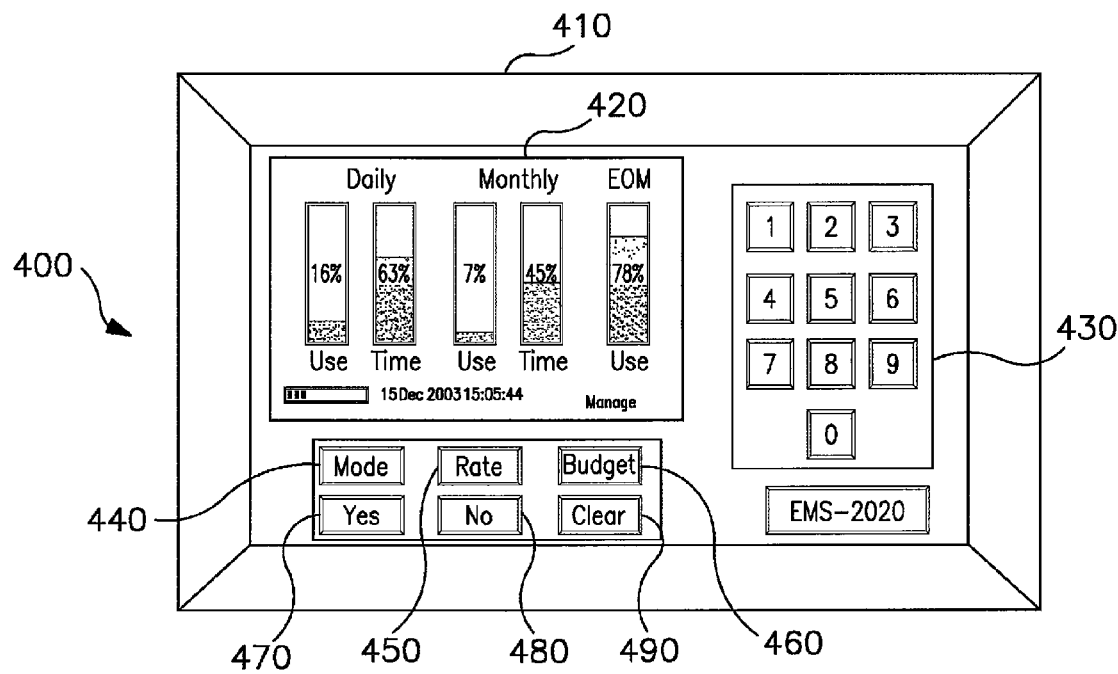
FIG. 4 is a graphic representation of an embodiment of the subscriber information and control apparatus, as depicted in FIG. 3, demonstrating an energy management and budget tracking mode of operation.
Figure 5:
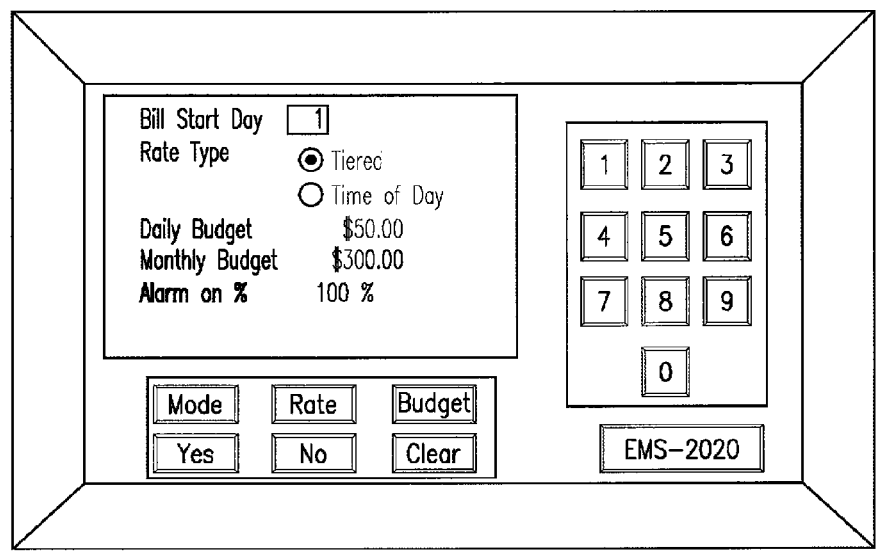
FIG. 5 is a graphic representation of the subscriber information and control apparatus, as depicted in FIG. 3, demonstrating the input of budget information.
Figure 6:
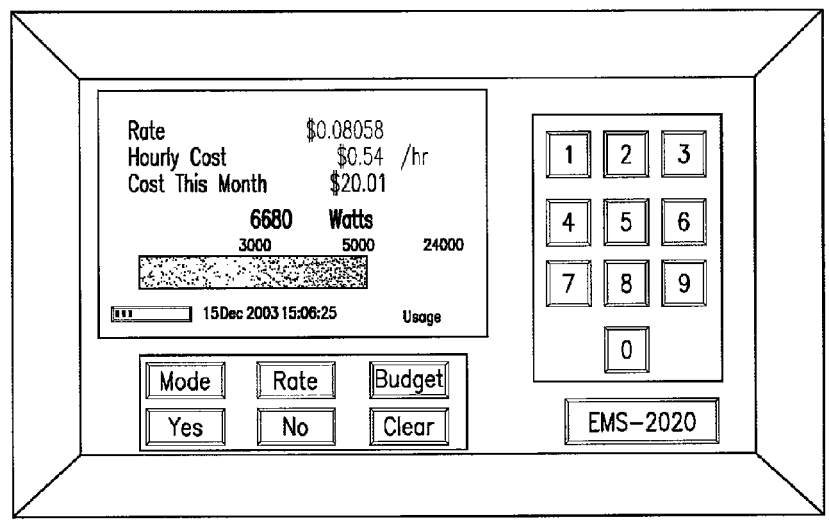
FIG. 6 is a graphic representation of the subscriber information and control apparatus, as depicted in FIG. 3, displaying a real-time cost associated with the operation of a heating system.

Referring to FIGS. 1 and 2, embodiments of a system at a location of a utility commodity subscriber for informing the subscriber of utility commodity cost and usage and for controlling utility commodity usage are depicted, in which like numerals are used to identify similar elements. Referring to FIGS. 4-6, an embodiment of the information and control apparatus, as depicted in FIG. 3, is depicted, in which like numerals are used to identify similar elements.

The subscriber's information and control apparatus is a local utility management system that is designed to enable residential utility customers to mange their individual electric, water and gas utility commodities. The information and control apparatus provides critical information to subscribers in order to support demand-side management. The system with its display and in-meter IUM module may be adapted to accept downloaded rate information form the utility commodity supplier and local monthly consumption information and perform the necessary mathematical operations to generate the actual bill thereby reducing the amount of data sent to the central location of the utility commodity supplier in the case of complex time-dependent rate tariffs. This is referred to as demand-side or subscriber-side billing. Systems and methods for performing subscriber-side billing are described in U.S. Pat. Nos. 5,960,416 and 6,377,938 B1, the disclosures of which are incorporated herein by reference.

The subscriber's information and control apparatus may be comprised of two, separable components: (1) an information and control panel, and (2) an interface that serves as the electronic interface and data transceiver between a utility meter and the panel. The panel provides the utility commodity subscriber with real-time and predictive pricing information upon which decisions can be made regarding utility usage.

The in-meter interface module, known as the intelligent utility module (IUM), is designed to act as a data collection, computation, storage and transfer gateway between the meter and the in-home display as described in the Intelligent Utility Module Functional Specification. The IUM also may act as an interface to a Real-Time Metering (RTM) RF network in order to support variable billing rates, such as TOU, Tiered, and Critical Peak Pricing (CPP). This interface provides an always-on link between the utility commodity suppliers and the subscribers that these systems support. Further, the IUM also collects data from the meter, and logs the data in in-meter memory to support gap filling for data lost during network outages. This ensures data consistency for accurate billing of utility commodities delivered.

Referring to FIG. 1, a schematic drawing depicts a system 100 at a location of a utility commodity subscriber for informing the subscriber of utility commodity cost and usage and for controlling utility commodity usage. An information and control apparatus for managing usage of utility commodities at a subscriber's location comprises two separate, but operationally connected, components: an interface 110 and an information and control panel 120. Interface 110 comprises a microprocessor, a memory, and a communications data link which enables interface 110 to receive data input from and to send control signals to the operably connected, plurality of utility meters, such as a gas meter 112, a water meter 114, and an electricity meter 116, and to exchange data and control signals with information and control panel 120. Although utility meters 112, 114, and 116 are depicted in FIG. 1, the plurality of utility meters may be selected from the group consisting of an electricity meter, a water meter, a gas meter, an oil tank level sensor, a propane tank level sensor, a thermostat, a temperature sensor, a relative humidity sensor, an appliance power sensor, and combinations thereof.

Interface 110 may be housed within one of the utility meters and, in particular, within electricity meter 116. Alternatively, interface 110 may be an external circuit or circuit board connected to a meter's digital memory using a local, electromechanical sensor, such as a photo-optical sensor (e.g., photo transistor and LED), to monitor utility commodity usage. Interface 110 comprises a microprocessor and a microprocessor clock and may comprise a memory or may use the memory and embedded firmware of the utility meter, by which interface 110 performs time dependent, interval data storage and accumulations. For example, a minimum of ninety-six (96), fifteen (15) minute intervals is logged and stored per day. Interface 110 also may serve as a link to a gateway 160 to WAN 170 gateway and a WAN to LAN interface. Gateway 160 may be a cable modem, an RF transceiver, a land-line or cellular telephone modem, a power line carrier modulation transceiver for bi-directional communications over cable lines, via a RF repeater network, over telephone land-lines or a cellular telephone network, or over power lines. Gateway 160 and WAN 170 allow bidirectional communication between a plurality of central locations for utility commodity suppliers, such as central locations 182 (gas supplier), 184 (water supplier), and 186 (electricity supplier) and interface 110.

In addition to bidirectional communications with information and control display 120, interface 110 may establish bidirectional communications with a subscriber's computer 130, a set top cable box 140, and a LAN 150. Subscriber's computer 130, such as a desktop or laptop computer or a personal digital assistant, may be used as an alternative information and control panel or source of utility commodity management and budgeting instructions. Because the subscriber's computer 130 generally will have greater memory capacity than the information and control apparatus 120, more data may be stored on subscriber's computer 130 than may be stored on the memories of information and control display 120 or interface 110, or both. Further, subscriber's computer 130 may permit remote management and budgeting control over WAN 170 or other networks. Similarly, the communication link between interface 110 and LAN 150 allows the subscriber to access interface 110 and information and control apparatus 120 from any communications device linked to LAN 130 at the subscriber's location and for interface 110 and for information and control display 120 to receive data from and send control signals to any meter or appliance linked to LAN 130. In addition, the link between interface 110 and set top cable box 140 allows for screens generated by information and control display 120 to be displayed on any monitor or television screen serviced by set top cable box 140. Further, emergency notifications of conditions, such as safety threats, severe weather conditions, homeland security issues, and the like, may be delivered to each subscriber over the cable television connections or WAN 170 and may be broadcast over the audible display of information and control display 120.

Referring to FIG. 2, a schematic drawing depicts another system 200 at a location of a utility commodity subscriber for informing the subscriber of utility commodity cost and usage and for controlling utility commodity usage. An information and control apparatus for managing usage of utility commodities at a subscriber's location comprises two separate, but operationally connected, components: an interface 210 and an information and control panel 220. Interface 210 comprises a microprocessor, a memory, and a communications data link which enables interface 210 to receive data input from and to send control signals to the operably connected, plurality of utility meters, such as a gas meter 212, a water meter 214, and an electricity meter 216, and to exchange data and control signals with information and control panel 220. Although utility meters 212, 214, and 216 are depicted in FIG. 2, the plurality of utility meters again may be selected from the group consisting of an electricity meter, a water meter, a gas meter, an oil tank level sensor; a propane tank level sensor, a temperature sensor, a thermostat, a relative humidity sensor, an appliance power sensor, and combinations thereof.

Interface 210 may be housed within one of the utility meters and, in particular, within electricity meter 216. Alternatively, interface 210 may be an external circuit or circuit board connected to a meter's digital memory using a local, electromechanical sensor, such as a photo-optical sensor (e.g., photo transistor and LED), to monitor utility commodity usage. Interface 210 comprises a microprocessor and a microprocessor clock and may comprise a memory or may use the memory and embedded firmware of the utility meter, by which interface 210 performs time dependent, interval data storage and accumulations. Unlike system 100 of FIG. 1, however, interface 210 does not serve as a link to a gateway 260 to WAN 270 gateway and a WAN to LAN interface. Instead, interface 210 and information and control panel 220 are linked through LAN 250, and gateway 260 is linked to LAN 250. LAN 250, gateway 260, WAN 170 permit bidirectional communication between interface 210 and information and control panel 220 and a plurality of central locations for utility commodity suppliers, such as central locations 282 (gas supplier), 284 (water supplier), and 286 (electricity supplier). Gateway 260 may be a cable modem, an RF transceiver, a land-line or cellular telephone modem, a power line carrier modulation transceiver for bi-directional communications over cable lines, via a RF repeater network, over telephone land-lines or a cellular telephone network, or over power lines.

In addition to bidirectional communications between information and control display 120 and interface 210, LAN 250 may establish bi-directional communications with a subscriber's computer 230 and a set top cable box 240. As noted above, subscriber's computer 230 may be used as an alternative source of utility commodity management and budgeting instructions. Because the subscriber's computer 230 generally will have greater memory capacity than the information and control display 220, more data may be stored on subscriber's computer 230 than may be stored on the memories of information and control apparatus 220 or interface 210, or both. Further, subscriber's computer 230 may permit remote management and budgeting control over WAN 270 or other networks. Similarly, the communication link between interface 210 and information and control panel 220 with LAN 250 allows the subscriber to access interface 210 and information and control display 220 from any communications device linked to LAN 250 at the subscriber's location and for interface 210 and information and control display 220 to receive data from and send control signals to any meter or appliance linked to LAN 250. In addition, the link between interface 210 and information and control display 220 with set top cable box 240 allows for screens generated by information and control display 220 to be displayed on any monitor or television screen serviced by set top cable box 240. Further, emergency notifications of conditions, such as safety threats, severe weather conditions, homeland security issues, and the like, may be delivered to each subscriber over the cable television connections or WAN 270 and may be broadcast over the audible display of information and control display 220.

In accordance with system 200 of FIG. 2, the information and control apparatus may comprise two discrete sets of electronics: interface 210 and information and control panel 220, which are operatively coupled by the LAN 250. Interface 210 comprises a microprocessor which is operatively coupled to the memory of one of the utility meters and is used to periodically poll various registers of a memory to obtain information, such as voltage, real time watts usage, reactive power (VARs,) accumulated kilowatt hours, and the like. As noted above, interface 210 may be housed within the meter (e.g., electricity meter 216), or interface 210 may be an external circuit or circuit board connected to the meter's digital memory using a sensor to monitor utility commodity (e.g., electricity) usage. Interface 210 may comprise a memory and embedded firmware, which performs the time dependent, interval data storage and accumulations. For example, a minimum of ninety-six (96), fifteen (15) minute intervals is logged and stored per day. This may be accomplished within meter 216 as it is part of the revenue and billing chain, which preferably does not pass through a system component, such as information and control panel 220, which may not be under control of the utility commodity supplier.

Referring to FIGS. 1 and 2, interface 110 or interface 220 may serve as the LAN hub with respect to the appliance modules, meter, or a thermostat interface. Alternatively, the information and control apparatus may be combined with the thermostat for HVAC control. Information and control panels 120 or 220 may comprise the elements absent from interface 110 or 210, respectively, and may comprise the key pad and subscriber interface components. Information and control panels 120 or 220 also could be configured to link interface 110 or 210 or LAN 150 or 250 to WAN 170 or 270. Nevertheless, because information and control panels 120 or 220 may be hand-held and battery operated, so that it may be carried to appliances or meters, it is undesirable to have a battery-operated, hand-held apparatus in the communications critical path between interface 110 or 210 and the central locations of the utility commodity suppliers, especially if the utility commodity central locations are using system 100 or 200 in an automatic load control mode of operation.

In addition, if the information and control apparatus is linked to the thermostat as a separate component or as part of the thermostat, it may be adapted to process a power factor or power quality (e.g., voltage current phase ratio) experienced by the heating, air conditioning, or HVAC system. By means of software/firmware algorithms appropriate to the particular unit, the information and control apparatus may predict preventive maintenance and provide warnings of a potential equipment (e.g., blower motor or compressor) failure in the system or to alert the subscriber that it is time to routine maintenance (e.g., filter changes or cleanings or refrigerant recharge) based on a signature analysis of the local power factor. Further, interface 110 or 210 may receive information on predicted local weather conditions and temperatures via WAN 170 or 210 from a weather reporting service (e.g., the National Oceanographic and Atmospheric Administration (NOAA)) and may adjust the thermostat to reflect efficient heating or cooling requirements.

The display of the subscriber's information and control apparatus is the interface between the utility and its customers. The display is designed primarily as a means of delivering critical real-time information that let the utility commodity subscriber manage their individual usage behavior. By providing real-time usage data in terms of dollars and cents (or other monetary units), the information and control apparatus allows the subscriber to calculate and display how much money is being spent on utility commodities on a monthly and daily basis. The subscriber's information and control apparatus also presents a platform for advanced services for the utility company, including, but not limited to, pre-payment of services, customer loyalty by providing advertising and electronic coupons and other content with partner retail companies. Further, the subscriber's information and control apparatus will act as a gateway for controlling in-home devices based on parameters within complete control of the end customer.

In addition, interface 110 may include at least one switching device 188 operably connected to the interface 110. Control signals generated by an interface microprocessor 189 are transmitted to the at least one switching device 188 by interface 110 through LAN 150 by way of I/O LAN 190. Interface 110 also includes memory 191 and memory 192 for storing utility data. An interface clock 193 determines time interval usage data for at least one utility commodity based on received measurement data. Interface 110 may further include at least one subscriber utility supply controller 194 operably connected to the interface 110. Utility controller 194 modulates the supply of the at least one utility commodity to the subscriber.

The leading solutions for demand-side, energy management target the industrial user and are far too costly for residential use. AMR solutions that are used at the residential level are able to collect and transmit usage information to the utility back office, but do not address the customer demand management requirements addressed by the subscriber's information and control apparatus. A technical advantage of the subscriber's information and control apparatus is to give the utility commodity suppliers the tools necessary to provide demand-side, energy management in order to reduce overall peak loads on the production network. The information and control apparatus provides real-time information to the subscriber, allows for the establishment of budgets and thresholds for alarm generation, and implements a platform for future automated control of appliances, thus allowing utility commodity suppliers to manage the overall demand on their networks.

Other technical advantages include providing utility usage information in real-time in dollars and cents so that the subscribers are able to understand and make adjustments to their usage behavior; presenting the current burn rate in watts (instantaneous power), cubic feet per minute (gas) and gallons per minute (water) provided by an in-meter IUM module; calculating the current burn rate in dollars and cents (or other monetary units) based on the instantaneous power, gas and water use provided by the IUM module; providing a clear presentation of usage versus time graph that may give the subscriber and snap shot of whether the subscriber is currently within the defined budget; providing means for the subscriber to define daily and monthly budget information as well as to set an alarm to warn the subscriber that the subscriber is in danger of exceeding the budget; supporting TOU rates and other variable rate structures (e.g., Tiered, CPP, and the like) defined by the utilities; providing weekly and annual trend graphs so that the user can see trends in use over defined time periods; providing a summary of the overall usage versus budget for all managed meters; supporting pre-payment and service connect and disconnect; and providing a platform for delivering advanced service such as advertising, news, sports, electronic coupons and other advanced services.

Referring to FIG. 3, a schematic drawing of an information and control apparatus 300, suitable for use in the systems of FIGS. 1 and 2, is depicted. Apparatus 300 combines the interface and information and control panel described in FIGS. 1 and 2 and consists of a central processing unit (CPU} board 310 and peripheral components which are linked to CPU board 310 or components of CPU board 310. CPU board 310 comprises a microprocessor 311, a Real Time Communication (RTC) module 312, an alarm buzzer 313, a Subscribers Identity Module (SIM) connection 314, and a GSM (cellular telephone and RF modem) module 315. SIM Connection 314 is linked to GSM module 315 to ensure secure access to apparatus 300. A RF module 320 is linked both to the various signal receiving components of CPU 300 generally and directly to microprocessor 311. RF module 320 is powered by a rechargeable battery 330, which battery 320 may be charged from an outside power source 340 via a CPU mounted charger 316. Subscriber input may be provided to the various components (e.g., microprocessor 311 or SIM connection 314) of CPU board 300 via keypad 350. Further, apparatus 300 may communicate via WAN or LAN with sources of data or control signals via external antenna 360. Screens stored in or generated by microprocessor 311 (including an internal memory) and data received via RF module 320 from meters or appliances or via external antenna 360 and GSM module 315 from other sources may be displayed on an LCD screen 370.

FIGS. 4-6 depict view of an embodiment of the information and control panel as described in FIGS. 1-3. Each view shows a different screen display. These displays are representative of some types of displays which may be used to convey usage information to the subscriber, but a variety of screen displays are possible, including, but not limited to the screen displays described below with respect to FIGS. 7-16. The screen display chosen for a particular embodiment may depend on the information to be conveyed and the screen space and presentation options (e.g., color variations and graphics) available in making the presentation.

Referring to FIG. 5, an information and control panel 400 is depicted. Information and control panel 400 comprises a casing 410, which may be adapted for mounting on a wall; display screen 420; a numeric keypad 430; and six (6) operational keys. The subscriber may use the operational keys to select operations to be programmed into information and control panel 400. A mode key 440 may be used to select between different modes of controlled operation. For example, the subscriber may choose to use information and control panel 400 as a thermostat or as a energy management or energy cost regulating device, and if so, for what utility commodity. The subscriber may use a rate key 450 to select from amongst various variable rate structures (e.g., TOU, Tiered, CPP, and the like). The subscriber also may use a budget key 460 to chose to budget usage of a particular utility commodity. The subscriber may use a "yes" key 470 and a "no" key 480 to select or reject options proposed by programming installed on the microprocessor or stored in the memory of information and control panel 400, and the subscriber may use a clear key 490 to remove incorrectly or erroneously made selections or entered instructions or values. For more complicated commands, the microprocessor of information and control panel 400 may be programmed to respond to the depressing of combinations of keys or the depressing of two or more keys simultaneously.

In FIG. 4, screen display 420 shows a graphic representation of the results of the use of information and control panel 400 for electrical energy management. In particular, screen display 420 shows five (5) bar graphs. From left to right across screen display 420, the first two (2) bar graphs show the daily budget as a percentage of the total maximum budgeted amount of electrical energy used and the percentage of time elapsed to use that amount. The next two (2) bar graphs show the monthly budget as a percentage of the total maximum budgeted amount of electrical energy used and the percentage of time elapsed to use that amount. The final bar graph shows the end of month (EOM) projected use based on the remaining days of the month and the average electrical energy use to the present day. If usage is below budgeted amounts for the first and third (i.e., the daily use and monthly use) bar graphs, these bar graphs may be shown in green. If, however, usage is above budgeted amounts for the first and third (i.e., the daily use and monthly use) bar graphs, the bar graphs may be shown in red. Similarly, the EOM projected usage bar graph may be shown in green or red, depending upon whether the EOM projected value is below or above the budgeted amount, respectively.

Referring to FIG. 5, screen display 420 shows a text representation of the programming of a subscriber driven budget on information and control panel 400. In particular, screen display 420 shows that the subscriber (or the utility commodity supplier) has selected a Tiered rate schema and that the subscriber has selected a maximum daily electrical energy budget of US$50.00 and a monthly electrical energy budget of US$300.00. Further, the subscriber has determined that the over-budget warning alarm shall sound only if actual usage approaches 100% of the daily budgeted amount or if the EOM projected usage exceeds the monthly budgeted amount.

Referring to FIG. 6, screen display 420 shows a graphic representation of the results of the use of information and control panel 400 as a budgeting thermostat. In this mode of operation, information and control panel 400 will reduce heating or air conditioning use in order to maintain energy usage within a budgeted amount. In particular, screen display 420 shows that the subscriber has budgeted 24000 Watts of electrical energy for the month of December. Through the first fifteen (15) days of December, however, the subscriber has used only 6680 Watts. Thus, the subscriber is on-track to use less than the budgeted amount of energy for December.

The Response Time Monitor (RTM) data link also is used for transmitting information from the central locations of utility commodity suppliers to the subscriber's information and control apparatus, such as variable rate pricing models, advertising, electronic coupons and other value added services. In addition, the subscriber's information and control apparatus provides a platform for customer prepayment and service connect/disconnect via the fixed RF network. By providing bi-directional communications between the subscriber's information and control apparatus the utility commodity supplier, the subscriber is able to control delivery of utility commodities.

EXAMPLES

Figure 7:
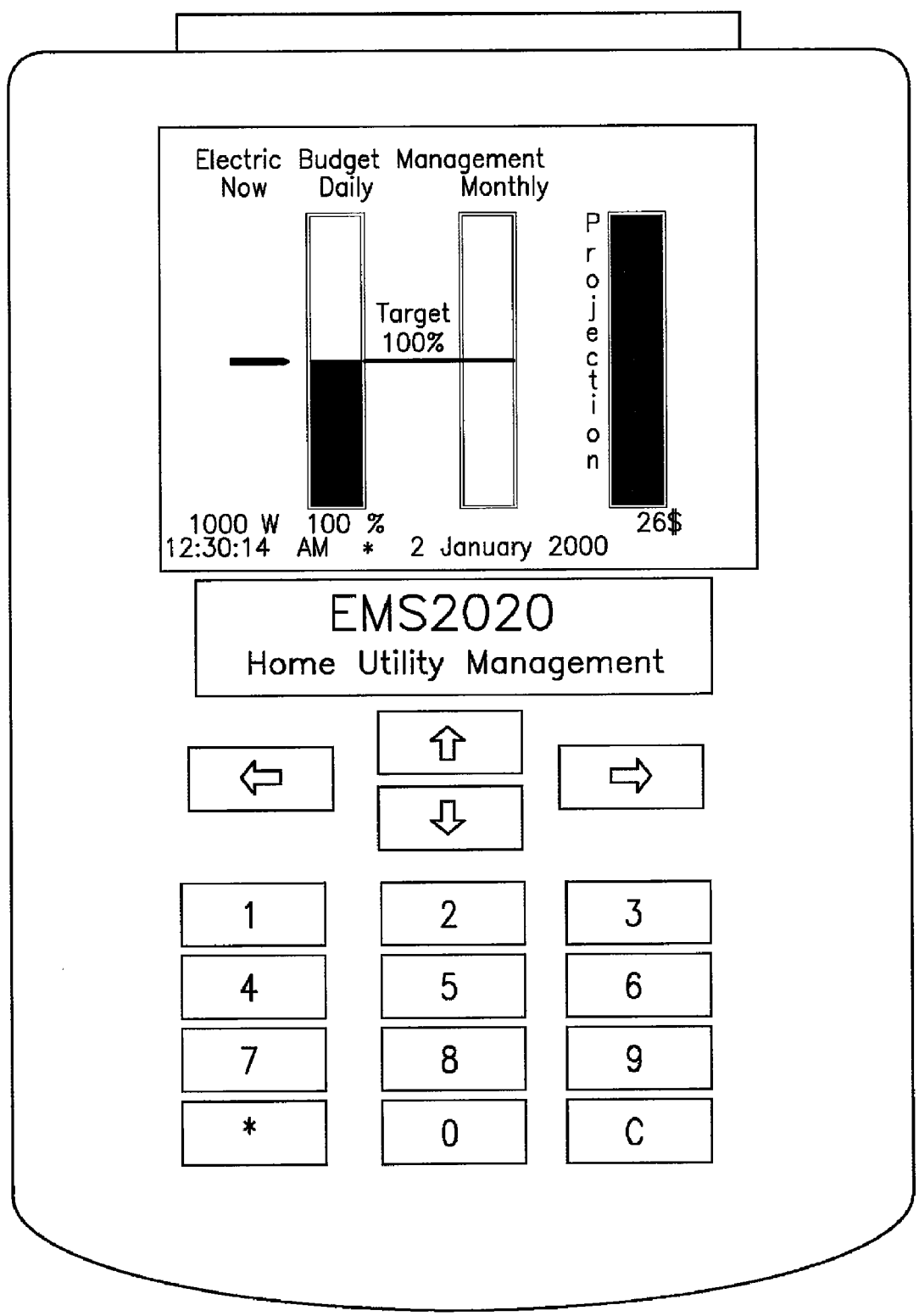
FIG. 7 is a graphic representation of another embodiment of the information and control apparatus, as depicted in FIG. 3.

The invention will be further clarified by a consideration of the following examples, which are intended to be purely exemplary of the use of the invention. Referring to FIG. 7, the subscriber's information and control apparatus product is comprised of hardware and software components. The subscriber's information and control apparatus may comprise of a wireless, data collection interface, a CPU, and power supply, Graphical User Interface (GUI), an optional cradle for battery operation, and twelve (12) key alphanumeric key pads for data entry and on four (4) directional keys for on-screen navigation. The hardware is portable, so that the subscriber may move about his or her location in order to see the affect of turning on and off power to appliances has on usage costs.

The software, which is ideally downloadable to the hardware, consists of data collection, data computation, storage and GUI functionality. The software also supports clock set, on-demand use rate information updates, and limited data transmission capabilities.

The subscriber's information and control apparatus provides both real-time and cumulative cost information based on readings from electric, water, and gas meters. The real time instantaneous usage information is displayed both in terms of rate of use (e.g., Watts, gallons/minute, or cubic feet/minute), as well as in dollars and cents (or other monetary units) per hour. Although these values are indicated in English units, read outs may be formatted to appear in metric units, as well. This provides the subscriber with the current rate of use in the household in a format that is relevant to budgeting. Accumulated usage costs are based on variable rate structures such as TOU, Tiered, or CPP demand rates.

The subscriber's information and control apparatus allows the subscriber to input daily and monthly budget values to track against current and accumulated usage. The budget and usage data are transformed into graphical representations to inform the subscriber of how well he or she is doing against the daily and monthly budgets. The subscriber's information and control apparatus is also capable of predicting how the subscriber will perform against budget at the end of the month based on average accumulated cost of usage. If the subscriber is in jeopardy of going over the end-of-month budget, the subscriber's information and control apparatus generates visible and/or audible alarms to notify the subscriber of this jeopardy.

The subscriber's information and control apparatus may be a cradle borne, portable, battery operated device. The subscriber's information and control apparatus collects data through a radio frequency device in the residential electric, gas and water meters. Further, the subscriber's information and control apparatus is capable of bi-directional communications through an on-board modem (e.g., GSM, CDMA, or TDMA wireless communication technologies). The subscriber's information and control apparatus provides non-volatile memory for storage of critical data, such as cumulated daily and monthly use and cost information, current variable rate data information, subscriber budget data, communications data for radio-frequency and modem communications, and utility meter identifiers for the residential meters in which the subscriber's information and control apparatus's interface may be housed.

The subscriber's information and control apparatus may be incased in plastic with a cutout for a video display, a twelve (12) key numeric keypad, a mode key, clear key, four (4) directional keys for on-screen navigation, an audible input indicator, and a key for backlighting the keypad and directional keys.

In an embodiment, the subscriber's information and control apparatus may have a width of about 15.24 cm, and preferably, the width shall not exceed about 20.32 cm. The height of the apparatus may be about 11.43 cm and preferably, the height shall not exceed about 15.24 cm. Similarly, the depth of the apparatus may be about 3.81 cm and preferably, the depth shall not exceed about 5.08 cm. The apparatus casing may be made of plastic and may include cutout portions to permit access to the display, a key pad for data input, a clear key, mode key, and navigation keys as shown in FIG. 7. If the apparatus includes an LCD display, the LCD backlight may become illuminated when any key is depressed, and may remain lit for a predetermined period of time, e.g., not less than about fifteen (15) seconds and not more than about thirty (30) seconds past last activity. The apparatus may provide directional keys for navigation vertically an horizontally through the various supported displays. Moreover, the apparatus may be adapted to operate off of internal, rechargeable batteries for up to about one hour when off power. The apparatus may provide an audible alarm (e.g., a buzzer may sound) when the battery life drops below a predetermined remaining time, e.g., about fifteen (15) minutes, and may include a reset key (e.g., "M" key) to acknowledge the alarm.

Preferably, the apparatus's casing may enclose the hardware components depicted in FIG. 3, including microprocessor 320, battery 330, display 370, key pad 350, RF module 311, antenna 360, and modem 315. The apparatus also may comprise a single piece, mounting/charging cradle as depicted in FIG. 3. The apparatus casing may be ruggedized to prevent breakage of internal components, when the apparatus is dropped from a predetermined height of not more than about 1.8 meters. Nevertheless, the apparatus's casing may permit access for programming and maintenance of hardware and software. Moreover, the apparatus's casing may include a cutout to support a detachable battery recharging cradle as shown in FIG. 3.

The keypad is used during installation to set up system parameters, such as the meters to be managed by the subscriber's information and control apparatus. The keypad also may be used as a data entry means during installation, and by subscribers to enter and manage monthly budgets. The keypad may generate an artificial click sound or other audible indication to confirm keypad entries. The apparatus's keypad may comprise a clear key labeled with "C," as depicted in FIG. 7. The apparatus's keypad may include four (4) directional or navigational control keys labeled with arrows, as depicted in FIG. 7. The apparatus also may comprise ten (10) numeric keys for inputting identification and budget data, as depicted in FIG. 7. The display backlight may be turned on with the touch of any key, and remain lit for about thirty (30) seconds after all key pad activity ceases. Alternatively, the apparatus's backlight may be activated by a key (not shown) labeled with the graphic of a light bulb. Preferably, the apparatus's keys are rubber coated and have a soft feel. The apparatus generates an audible confirmation when data is entered from numeric keys.

As described above, the subscriber's information and control apparatus may comprise a visual (e.g., a graphic) or audible display. The visual display may be adapted to display alphanumeric or graphical data, or both. Preferably, the visual display may comprise a color LCD display (e.g., a Quarter Video Graphics Array (QVGA) display). Because unit cost may be an important factor in the design of the subscriber's information and control apparatus, the visual display alternatively may comprise either a backlit black and white dot matrix display or a custom display with both text and graphics. The display may comprise a screen measuring about 7.62 cm diagonally, and preferably, comprises a screen measuring in a range of about 6.86 cm to about 9.65 cm, diagonally. The vertical dimension may be sufficient to display up to about six (6) lines of text and uncomplicated graphics, such as graphic bars. In another preferred embodiment, the display screen is backlit for a black and white display, or displayed on demand, or displayed continually, if in color.

In addition, the display of the subscriber's information and control apparatus may be adapted to displaying multiple individual displays containing different information, such as usage, budget, and cost information for a variety of utility commodities. As discussed further below, the apparatus also may comprise an internally and externally settable clock and provide the current-time on each dialog defined in these examples. Preferably, the apparatus is adapted to provide a graphical activity indicator for each dialog defined in these examples.

The subscriber's information and control apparatus, described in this example, must have sufficient memory to run the software providing the functionality discussed below. This memory requirement may exceed 100 Kbytes to support full feature functionality. Preferably, the memory comprises a capacity with as much as a 50% expansion margin for additional features and functionality. The actual memory expansion margin may depend on the unit cost of production. The subscriber's information and control apparatus also may provide non-volatile memory to store critical data such as cumulative summary data, rate definitions, communications parameters, and budget definitions.

In particular, the subscriber's information and control apparatus may comprise sufficient memory capacity to support the functionalities described in some or all of Tables 1-6 below. For example, the apparatus may provide non-volatile storage for subscriber defined budget data supporting electricity, gas, and water usage, as defined in Table 1. The apparatus also may provide non-volatile storage for up to four (4) time periods for TOU rate data, as defined in Table 2, when the rate type defined by the budget data is a TOU rate. The apparatus further may provide non-volatile memory for storage of daily, monthly, and total cumulative (accumulated) usage data, as shown in Table 5. In addition, the apparatus may provide non-volatile storage of meter identifiers for at least one electric, at least one gas, and at least one water meter, as defined in Table 6. Alternatively, the apparatus may provide for storage of at least two (2) rate schemas (e.g., present and pending) for the supported rate types (e.g., TOU, Tiered, or CPP). When the rate-type defined by the budget data is a Tiered rate, the apparatus may provide non-volatile storage for up to four (4) tiers of rate data, as defined in Table 3. When the rate-type defined by the budget data is CPP, the apparatus may provide non-volatile storage for up to four (4) CPP periods, as shown in Table 4.

The subscriber's information and control apparatus is adapted to provide a means (e.g., keypad) for the subscriber to enter budget data for electricity, water, and gas utility commodities. This budget data may be used to compute values that are presented graphically on the screen display to show how much of the available budget of a utility commodity has been used within the allotted daily or monthly measurement period. The monthly budget and alarm values may be used to compute predicted, EOM values based on usage to date and current usage rate, and generate alarms when the monthly budget is in jeopardy of being exceeded. Table 1 below defines the values that make up the budget store.

TABLE 1

Budget Data Storage

| Name | Type | Default Value | Description |
|---|---|---|---|
| Billing Start Day | Integer | 1 | The day of month on which the billing period begins. |
| Rate Type | Integer | 1 | 1 - Time-of-Use<br>2 - Tiered<br>3 - Critical Peak Pricing<br>4 - Fixed |
| Daily Budget Electricity | Integer | 5 | User defined daily budget in terms of currency (e.g., Dollars US [$]) |
| Monthly Budget Electricity | Integer | 150 | User defined monthly budget in terms of currency (e.g., Dollars US [$]) |
| Alarm Limit Electricity | Integer | 100 | Threshold in terms of predicted end-of-month use above which alarms are generated. |
| Billing Start Day Gas | Integer | 1 | The day of month on which the billing period begins. |
| Rate Type Gas | Integer | 1 | 1 - N/A<br>2 - Tiered<br>3 - N/A<br>4 - Fixed |
| Daily Budget Gas | Integer | 5 | User defined daily budget in terms of currency (e.g., Dollars US [$]) |
| Monthly Budget Gas | Integer | 150 | User defined monthly budget in terms of currency (e.g., Dollars US [$]) |
| Alarm Limit Gas | Integer | 100 | Threshold in terms of predicted end-of-month use above which alarms are generated. |
| Billing Start Day Water | Integer | 1 | The day of month on which the billing period begins. |
| Rate Type Water | Integer | 1 | 1 - N/A<br>2 - Tiered<br>3 - N/A<br>4 - Fixed |
| Daily Budget Water | Integer | 5 | User defined daily budget in terms of currency (e.g., Dollars US [$]) |
| Monthly Budget Water | Integer | 150 | User defined monthly budget in terms of currency (e.g., Dollars US [$]) |
| Alarm Limit Water | Integer | 100 | Threshold in terms of predicted end-of-month use above which alarms are generated. |

The subscriber's information and control apparatus also supports TOU rate structures for at least about four (4) time periods during each day. The data is defined by a rate schema, such as one of the rate schema described below, and provides for three (3) rate-types: low, medium, and high rates, based on season. The apparatus is adapted to store two (2) schemas (e.g., current and pending) in a non-volatile memory for up to four (4) time periods per day. For example, this may mean that the non-volatile memory may be adapted to store one or two of each of a low, medium, or high rate period per day. The time periods may be defined uniquely by the end time of each period, which also marks the beginning of the next period. The parameters that define the time-of-use data store are shown in Table 2 below.

TABLE 2

TOU Rate Data Storage

| Name | Type | Default Value | Description |
|---|---|---|---|
| Effective Start Date | Integer | 01012000 | Start Date when Schema comes into Effect |

TABLE 2-continued

TOU Rate Data Storage

| Name | Type | Default Value | Description |
|---|---|---|---|
| End Time | Integer | 0000 | Indicates the End Time for the current period and Start Time for the next |
| Rate | Integer | 00000 | Rate in currency to 5 significant digits (e.g., $0.08084) |

Similarly, the subscriber's information and control apparatus also supports Tiered rate structures. Tiered rate structures are defined by limits of total accumulated costs for utility commodities. The data is defined by another of the rate schema described below, and may be adapted to provide for at least three (3), but not more than four (4), tiers of rates. The parameters that define Tiered rate structure are shown in Table 3 below.

TABLE 3

Tiered Rate Data Storage

| Name | Type | Default Value | Description |
|---|---|---|---|
| Effective Start Date | Integer | 01012000 | Start Date when Schema comes into Effect |
| High Rate Value | Integer | 00000 | Indicates the maximum value in terms of kWh (gallons/cubic meters for water/gas) for which the rate applies. The lowest value starts at zero accumulated use. |
| Rate | Integer | 00000 | Rate in currency to 5 significant digits (e.g., $0.08084) |

In addition, the subscriber's information and control apparatus may utilize and support CPP rates. The CPP rate is a rate used when the aggregate network use exceeds the network transmission capacity. Such CPP rates may be implemented during time periods defined by the utility commodity supplier. The parameters that define a CPP rate structure are shown in Table 4 below.

TABLE 4

CPP Data Storage

| Name | Type | Default Value | Description |
|---|---|---|---|
| Effective Start Date | Integer | 01012000 | Start Date when Schema comes into Effect |
| Critical Peak Start Date | Integer | 00000000 | Start Date for CPP rate yyyymmdd |
| Critical Peak Start Time | Integer | 0000 | Start Time for CPP rate hhmm |
| Critical Peak End Date | Integer | 00000000 | End Date for CPP rate yyyymmdd |
| Critical Peak End Time | Integer | 00000 | End Time for CPP rate hhmm |
| Rate | Integer | 000000 | Rate in currency to 6 significant digits (e.g., $0.08084) |

In order to prevent or reduce the loss of time sensitive data resulting from a loss of electrical power to the subscriber's information and control apparatus, the apparatus may be adapted and configured to store daily and monthly, usage data in terms of use (e.g., kWh, liters, cubic meters) and cost (e.g., dollars or other monetary units). The parameters that define a this stored accumulated usage data are shown in Table 5 below.

TABLE 5

Usage Data Storage

| Name | Type | Default Value | Description |
|---|---|---|---|
| Total Accumulated Electricity Use | Double | 0.00000 | Accumulated kWh value since the reset of the meter or apparatus initialization (TBD)* |
| Total Accumulated Electricity Cost | Double | 0.00 | Accumulated cost since APPARATUS initialization or start of year (TBD)* |
| Total Daily Accumulated Electricity Use | Double | 0.00000 | Accumulated kWh value since the beginning of the day.* |
| Total Daily Accumulated Electricity Cost | Double | 0.00 | Accumulated cost since the beginning of the day |
| Total Monthly Accumulated Electricity Use | Double | 0.00000 | Accumulated kWh value since the beginning of the month.* |
| Total Monthly Accumulated Electricity Cost | Double | 0.00 | Accumulated cost since the beginning of the month |
| Low Rate Daily Use | Double | 0.00000 | Daily use during low rate period. |
| Mid Rate Daily Use | Double | 0.00000 | Daily use during medium rate period. |
| High Rate Daily Use | Double | 0.00000 | Daily use during high rate period. |
| Low Rate Daily Cost | Double | 0.00 | Daily cost during low rate period. |
| Mid Rate Daily Cost | Double | 0.00 | Daily cost during medium rate period. |
| High Rate Daily Cost | Double | 0.00 | Daily cost during high rate period. |
| Low Rate Monthly Use | Double | 0.00000 | Monthly use during low rate period. |
| Mid Rate Monthly Use | Double | 0.00000 | Monthly use during medium rate period. |
| High Rate Monthly Use | Double | 0.00000 | Monthly use during high rate period. |
| Low Rate Monthly Cost | Double | 0.00 | Monthly cost during low rate period. |
| Mid Rate Monthly Cost | Double | 0.00 | Monthly cost during medium rate period. |
| High Rate Monthly Cost | Double | 0.00 | Monthly cost during high rate period. |
| Last Collection Time | Date | Yyyymmddhhmmss | The last time a data point was collected so that use rate can be computed from a known time. |
| Last Accumulated Use Value | Double | 0.00000 | The last measured value from the meter so that use rate can be computed. |

*These values may be computed as alternatives.

The subscriber's information and control apparatus may be adapted to manage an electric, water, and gas meter at the subscriber's usage location. The apparatus also may be adapted to provide storage for data for up to two (2) addition meters. In order to manage these devices, the subscriber's information and control apparatus has each meter's identification information stored in its non-volatile memory in order to capture beacon messages transmitted by the respective meters, and to communicate with selected meters for time set and data request messages.

TABLE 6

Managed Meter ID Data Storage

| Name | Type | Default Value | Description |
|---|---|---|---|
| Electric Meter ID | Long | 00000000 | Globally unique meter identifier. 3 Byte (8 digit) |
| Gas Meter ID | Long | 00000000 | Globally unique meter identifier. 3 Byte (8 digit) |
| Water Meter ID | Long | 00000000 | Globally unique meter identifier. 3 Byte (8 digit) |
| TBD | | | |
| TBD | | | |

The subscriber's information and control apparatus has a plurality of dialogs or display modes that are adapted to permit subscribers with various levels of technical sophistication to use the system. It is through these dialogs that the subscriber may manage location specific usage of electrical, gas, and water utility commodities. It also is through these dialogs that the subscriber may alter subscriber use patterns to achieve the subscriber objectives for reduced utility commodity cost and for reduced peak demands for utility commodities. The dialogs specified in these examples are illustrative only, and may be altered in their look and feel without altering the functionality of the system.

Figure 8:
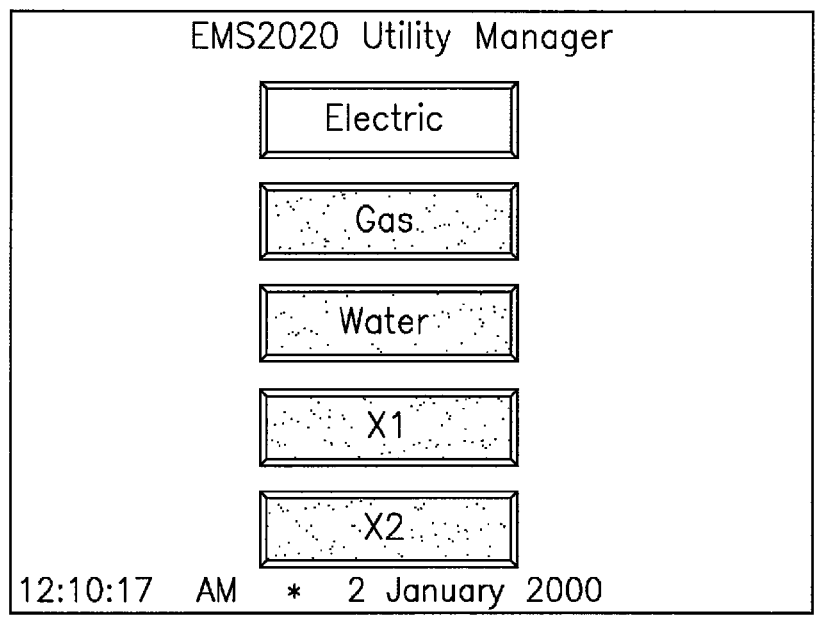
FIG. 8 depicts a subscriber's home dialog screen display on the information and control apparatus, as depicted in FIG. 7.

When the subscriber's information and control apparatus is initialized, the screen display may default to a screen that provides a summary of the overall predicted end of month use versus budget, and allows the subscriber to navigate through the various screens and dialogs of the apparatus to obtain a breakdown of use on a utility commodity by utility commodity basis. Referring to FIG. 8, the home dialog screen displays touch screen buttons or icons that allow the subscriber to select the utility commodity of interest to monitor. As noted above, the arrow keys depicted in FIG. 7 may be used to navigate the system. The up and down arrows are used to select and highlight an item for selection. The right arrow selects the key that is highlighted except on the lowest item level where the right arrow allows the subscriber to scroll through budget management, real-time, daily and monthly detail dialogs. The left arrow may be used to return to the previous item level. The left button labels on the Home dialogue may be based on the meter configuration dialogue described in Table 11 below. Thus, the apparatus's Home dialogue is adapted to provide total use summary data for all of the managed meters and to present a summary prediction of end-of-month total costs.

Figure 9:
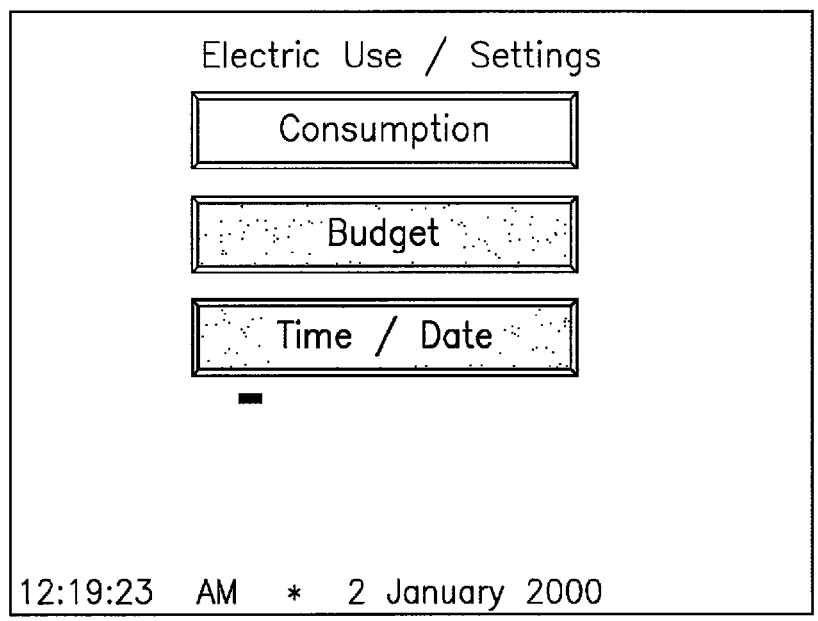
FIG. 9 depicts a subscriber's budget/use selection dialog, screen display on the information and control apparatus, as depicted in FIG. 7.

Referring to FIG. 9, the Budget/Use Selection dialog is accessed by highlighting a utility commodity in the Home dialog using the up and down arrow keys and then selecting the utility commodity using right arrow key. This dialog allows the subscriber to access the Budget Management dialog screen of FIG. 11 or the Budget Settings dialog screen of FIG. 10 by highlighting the desired selection and clicking the right arrow key.

The ability of the subscriber to review the cost of their use of utility commodities in real time is critical to understanding how subscriber behavior relates directly to cost. Nevertheless, merely knowing how much a subscriber is spending now and how much the subscriber has spent from the beginning of the billing period may not be sufficient. In order to assist the subscriber in making his or her utility commodity usage decisions, the subscriber's information and control apparatus present data in a uncomplicated graphical form. Other dialog screens provide supporting information that may be desired by the inquisitive subscriber. Importantly, however, the subscriber is provided with means to define budgets and track current use of utility commodities against those budgets.

Figures 10, 11:
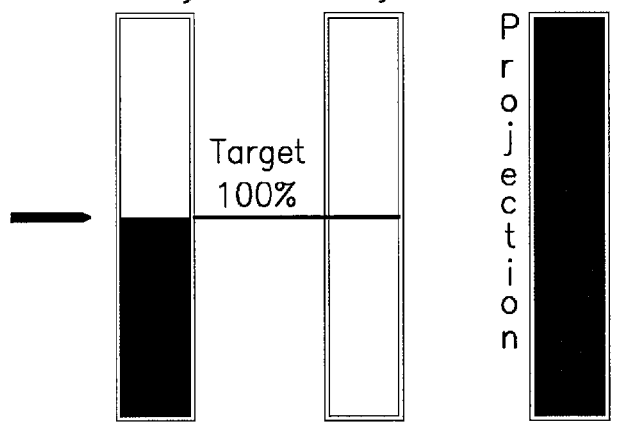
FIG. 10 depicts a subscriber's budget definition dialog, screen display on the information and control apparatus, as depicted in FIG. 7.
FIG. 11 depicts a subscriber's electric budget management, dialog screen display on the information and control apparatus, as depicted in FIG. 7.

The subscriber's information and control apparatus comprises means (a keypad, modem, USB port, or other data link) to enter daily and monthly budget parameters, and an alarm threshold or usage differential in order the assist the subscriber in managing his or her utility commodity usage. Referring to FIG. 11, the screen dialog displays information that is supported by the subscriber's information and control apparatus for each managed utility commodity service (e.g., electricity, water, natural gas or propane, and the like). The data input by the subscriber, as shown in Table 7, includes Daily and Monthly Budget values, and the "Alarm On %" value for each utility commodity service. The subscriber inputs this data either through a numeric key pad or, if no keypad is present, then via directional keys and on screen controls. The subscriber may change these values and have them applied in real time. Preferably, the Bill Start Day and Rate Type may be downloaded from the utility commodity supplier via GSM or Fix Reader wireless network, and only manually input if there is no connection to utility commodity suppliers at a plurality of central locations. The Fix Reader wireless network is available from Arad Technologies, Ltd. of Yokneam Elit, Israel.

TABLE 7

Budget Data Dialog

| Name | Type | Format | Description |
|---|---|---|---|
| Billing Start Day Electricity | Integer | nn | The day of month on which the billing period begins. |
| Rate Type | String | $sssssss | 1 - Time-of-Use (TOU) 2 - Tiered (Tier) 3 - Critical Peak Pricing (CPP) 4 - Fixed (Fixed) |
| Daily Budget Electricity | Integer | $nnn | User defined daily budget in terms of currency (e.g., Dollars US [$]) |
| Monthly Budget Electricity | Integer | $nnn | User defined monthly budget in terms of currency (e.g., Dollars US [$]) |
| Alarm Limit Electricity | Integer | nnn% | Threshold in terms of predicted end-of-month use above which alarms are generated. |
| Billing Start Day Gas | Integer | nn | The day of month on which the billing period begins. |
| Daily Budget Gas | Integer | $nnn | User defined daily budget in terms of currency (e.g., Dollars US [$]) |
| Monthly Budget Gas | Integer | $nnn | User defined monthly budget in terms of currency (e.g., Dollars US [$]) |
| Alarm Limit Gas | Integer | nnn% | Threshold in terms of predicted end-of-month use above which alarms are generated. |
| Billing Start Day Gas | Integer | nn | The day of month on which the billing period begins. |
| Daily Budget Water | Integer | $nnn | User defined daily budget in terms of currency (e.g., Dollars US [$]) |
| Monthly Budget Water | Integer | $nnn | User defined monthly budget in terms of currency (e.g., Dollars US [$]) |
| Alarm Limit Water | Integer | nnn% | Threshold in terms of predicted end-of-month use above which alarms are generated. |

Referring to FIG. 11, the subscriber's information and control apparatus is adapted to provide a graphical display allowing the subscriber to quickly see how she or he is performing with respect to personal management of utility commodity usage in the subscriber's location. Daily and Monthly bar graphs indicate how well the subscriber is doing against budget at the current moment in time. The data may be presented as a ratio of usage versus time. This ratio indicates in terms of dollars and cents or other monetary units whether the subscriber is currently within budget for the time period in question. Values below 100% indicates that at this moment the subscriber is doing well with respect to the budget. A secondary indicator to the side of the current budget bar graphs is a sliding scale that indicates whether, based on current utility commodity usage, the subscriber is improving performance or failing to meet performance standards with respect to his or her budget. Though this dialog does not guarantee that desired EOM results will be achieved, it does indicate a trend important to the subscriber.

The Projection bar graph is a predicted value based on average past utility commodity usage that may be used to predict whether the subscriber is in jeopardy of exceeding the budget. The apparatus may present a graphical bar for each utility meter indicating a percentage representing the ratio of usage (in dollars and cents) over budget, versus the current time within the time period (in seconds) over the total daily time period or over the total monthly time period. (i.e., (Dollars-to-Date/Budget)/(Time-To-Date/Total Time Period). Though this is not a guarantee budget will not be exceeded, a value below 100% is an acceptable indication that the subscriber may stay within budget for the billing period. If values are currently above 100% ("all systems red") this is an acceptable indication that the subscriber is in jeopardy exceeding the budget for the billing period, and values below 100% ("all systems green") indicate that the subscriber is doing better than planned. If the monthly use rate is high and the predicted EOM cost is above budget, the subscriber may wish to reexamine and, possibly, reduce his or her current usage. If, however, the utility commodity usage rate is low and the predicted EOM cost is below budget, the subscriber need not change his or her usage. If the usage rate is low and the EOM cost is above budget, this indicates that the subscriber is correcting his or her usage toward achieving the budget at this point in the month.

Figure 12:
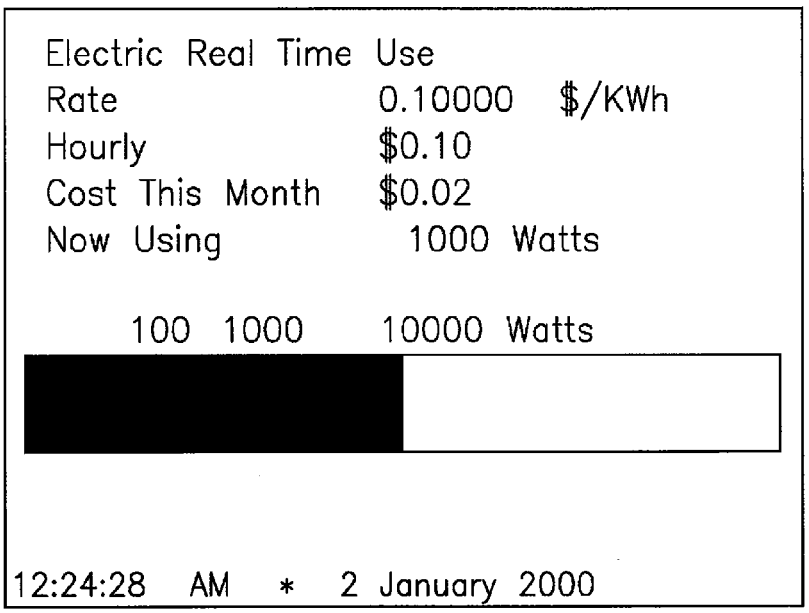
FIG. 12 depicts a subscriber's electric real time use, dialog, screen display on the information and control apparatus, as depicted in FIG. 7.

The information used to manage the use of utility commodities at the subscriber's location is the current rate at which those utility commodities are used. Although usage may be determined based on instantaneous power (Watts) for electricity, and flow rates (gallons per minute or cubic feet per minute) for natural gas or propane and water, these rates have limited meaning value to the majority of subscribers. Significantly more useful and meaningful to most subscribers, however, is the amount in dollars and cents (or other monetary units) that the usage of utility commodities costs the subscriber on an hourly, daily, or monthly basis. Referring to FIG. 12, information, which may be of most basic interest to the subscriber, is illustrated; namely, how much each unit of a particular utility commodity (i.e., electricity) costs, how much that cost translates into in dollars per hour, along with how much has been spent to date. The data input to the apparatus to achieve this graphic display is shown in Table 8.

TABLE 8

Real Time Use Data Dialog

| Name | Type | Format | Description |
| --- | --- | --- | --- |
| Electricity Rate | Double | $n.nnnnn | Current rate being applied. |
| Hourly Cost Electricity | Double | $nnnn.nn | Hourly Cost at current rate. |
| Cost This Month Electricity | Double | $nnnnn.nn | Cost of electricity consumed this month. |
| Current Electrical Use | Integer | sssss | Presented both textually and graphically in kWh |

TABLE 8-continued

Real Time Use Data Dialog

| Name | Type | Format | Description |
| --- | --- | --- | --- |
| Gas Rate | Double | $n.nnnnn | Current rate being applied. |
| Hourly Cost Gas | Double | $nnnn.nn | Hourly Cost at current rate. |
| Cost This Month Gas | Double | $nnnnn.nn | Cost of electricity consumed this month. |
| Current Gas Use | Integer | sssss | Presented both textually and graphically in cubic feet/hour |
| Water Rate | Double | $n.nnnnn | Current rate being applied. |
| Hourly Cost Water | Double | $nnnn.nn | Hourly Cost at current rate. |
| Cost This Month Water | Double | $nnnnn.nn | Cost of electricity consumed this month. |
| Current Water Use | Integer | sssss | Presented both textually and graphically in gallons/hour |

Figure 13:
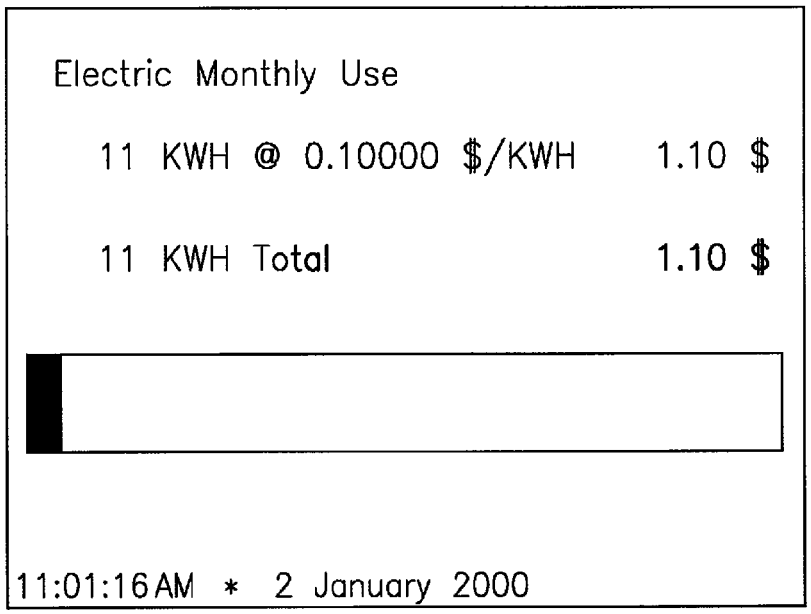
FIG. 13 depicts a subscriber's electric monthly use dialog, screen display on the information and control apparatus, as depicted in FIG. 7.

Referring to FIG. 13, the Monthly Use dialog displays the use and cost for low, medium, and high rates for utility commodity usage, updated on a daily basis. The dialog is reset monthly, and the dialog also graphically presents accumulated total usage information, cost, and percent of budget. Although FIG. 13 refer to electricity usage, the data input to the apparatus to achieve this graphic display, as shown in Table 9, makes clear that this dialog applies readily to water and natural gas or propane usage, as well. Further, the graphic display may readily be modified to provide for dialog displays relating to other types of utility commodities.

TABLE 9

Monthly Use Data Dialog

| Name | Type | Format | Description |
| --- | --- | --- | --- |
| Total Accumulated Use in kWh for Electricity | Integer | nnnnn | kWh as measured in the host meter. |
| Total Accumulated Cost | Currency | $nnnn.nn | Cost since apparatus initialization or since beginning of year. |
| Low, Medium, High Monthly Use in kWh | Float | nnnnn.nn | KWh values from the meter distributed into the appropriate rate bin for variable rate pricing. |
| Low, Medium High Rates | Float | $n.nnnnn | Rates as defined by the rate type currently being implemented. |
| Low, Medium and High Monthly Cost for Electricity | Currency | $nnnn.nn | Current accumulated cost at each rate. |
| Total Accumulate Monthly Use | Float | nnnnn.nn | KWh values from the meter distributed into the appropriate rate bin for variable rate pricing. |
| Monthly Use at Rates for Gas | Float | nnnnn.nn | Cubic Meters values from the meter distributed into the appropriate rate bin for variable rate pricing, or single bin for fixed rate. |
| Monthly Cost at Rates for Gas | Float | $n.nnnnn | Current accumulated cost at each rate. |
| Monthly Use at Rates for Water | Float | nnnnn.nn | Gallons values from the meter distributed into the appropriate rate bin for variable rate pricing, or single bin for fixed rate. |

TABLE 9-continued

Monthly Use Data Dialog

| Name | Type | Format | Description |
| --- | --- | --- | --- |
| Monthly Cost at Rates for Water | Float | $n.nnnnn | Current accumulated cost at each rate. |

Referring to FIG. 14, the subscriber's information and control apparatus provide rate dialogs that present the current seasonal rate information based on the type of rate plan that has been implemented. Minimally, the subscriber's information and control apparatus supports TOU rates. Nevertheless, referring to FIG. 15, the subscriber's information and control apparatus also is adapted to support Tiered, CPP, and fixed rates. Further, the apparatus is adapted to provide a dialog to present rate schemas for each rate type supported, for up to four (4) rate periods and three (3) rate levels (e.g., low, medium, and high). The subscriber's information and control apparatus computes and stores the daily peak demand in order to determine whether the CPP value has been exceeded over the billing period. The daily peak demand is an average peak demand measured over a predetermined measurement period. The subscriber's information and control apparatus also may compute and store the daily peak demand over a predetermined period of time within the monthly billing period.

As noted above, the subscriber's information and control apparatus is adapted to assist the subscriber in managing his or her monthly utility usage. Minimally, this means notifying the subscriber that his or her monthly budget is in jeopardy based on the subscriber's input budget parameters described previously, accumulated usage-to-date, and current usage, taking into account variable rates over the remainder of the month. Referring to FIGS. 10 and 11, both audible and visible alarms may be provided, so that the subscriber may alter his or her current usage in an attempt to keep within budget. By adjusting the alarm threshold, and turning off or moderating the operation of various household appliances, the subscriber may begin to evaluate the cost of, and make changes to, usage behavior. Moreover, the apparatus may be adapted to automatically clear alarms when the alarm condition no longer exists (e.g., the EOM projection drops below the alarm threshold value). In addition, the apparatus may be adapted to allow the subscriber to clear audible and visible alarms when they are generated, such that if the threshold is crossed again, the alarm may generate again. Alternatively, the subscriber may suppress audio alarms completely or adjust the volume for audible alarms.

Preferably, the subscriber's information and control apparatus is adapted to enable the subscriber to control devices, such as set back thermostats, when an alarm threshold is exceeded. Load control needs may have at least three (3) determining action sources. First, the utility commodity supplier may transmit a signal to the apparatus via a wide area network instructing the apparatus to turn off or moderate the operation of certain appliances (e.g., HVAC controls or systems). This action source may be of particular importance in extreme stage three (3), power shortage conditions. In this case, the utility commodity supplier transmits a digitized audio data signal for emergency rate deployment, together with homeland security or other public service announcements. The internal speaker of the apparatus may "play" such audio messages. Such utility control actions are supervised, such that receipt of a signal from a utility commodity supplier which turns off a subscriber's HVAC control or system or other significant appliance, also generates a confirmation or action taken signal, which is transmitted back to the utility commodity supplier. Second, the system may be adapted through the use of preprogrammed or calculated thresholds to exercise appliance control under local software/firmware control. Third, the subscriber may set the system via the subscriber's information and control apparatus to manual control only, thereby giving him or her the ability to control appliances for the keypad, but lock out control signals from the utility commodity supplier. Such a lock out action may subject the subscriber to utility commodity usage costing at a higher rate.

An administrative login and meter configuration dialog may be provided, so that the subscriber's information and control apparatus may be configured during installation. The subscriber logs in using a default username and password (which may be changed after first login). Preferably, the subscriber's information and control apparatus login dialog may encrypt the subscriber password. The password dialog text box is masked so that the login cannot be easily obtained. For example, the login dialog is accessed from the Use/Budget selection dialog by pressing the "M" and "C" keys simultaneously. Table 10 defines the subscriber login dialog:

TABLE 10

Login Dialog Data

| Name | Type | Format | Description |
| --- | --- | --- | --- |
| User Name | String | ssssss | Must be 6 characters and contain both characters and numbers. |
| Password | Masked String | ****** | Must be 6 characters and contain both characters and numbers, but must be different from the User Name. |

In order to control utility meters, including electric, gas and water meters, at the subscriber's location, the subscriber's information and control apparatus provide a Modem and Meter Configuration dialog to permit the subscriber to configure the apparatus with meter identification and meter type for those electric, gas and water meters managed at the subscriber's location. It is preferred that this dialog permits at least five (5) meters to be configured for control by the subscriber's information and control apparatus.

TABLE 11

Meter Configuration Dial

| Name | Type | Format | Description |
| --- | --- | --- | --- |
| Modem Phone Number | Long | nnnnnnnnnn | Phone number for APPARATUS Modem. |
| Meter Id | Long | nnnnnnnn | Globally unique six byte (8 numeric) value. |
| Meter Type | Enum | ssssssssss | Gas, Water, Electricity |
| Meter Id | Long | nnnnnnnn | Globally unique six byte (8 numeric) value. |
| Meter Type | Enum | ssssssssss | Gas, Water, Electricity |
| Meter Id | Long | nnnnnnnn | Globally unique six byte (8 numeric) value. |
| Meter Type | Enum | ssssssssss | Gas, Water, Electricity |
| Meter Id | Long | nnnnnnnn | Globally unique six byte (8 numeric) value. |
| Meter Type | Enum | ssssssssss | Gas, Water, Electricity |
| Meter Id | Long | nnnnnnnn | Globally unique six byte (8 numeric) value. |
| Meter Type | Enum | ssssssssss | Gas, Water, Electricity |

Because of the various communication paths which may be established in the systems described herein, various communication protocols may be established. Initially, the subscriber's information and control apparatus may provide a dialog that allows the subscriber to configure the modem telephone number. Examples of such dialogs are well known. With respect to communications between the utility meters and the subscriber's information and control apparatus, the apparatus is adapted to present cumulative and real-time data to the subscriber. The current mode of operations for a utility meter with Third-Generation (3G) wireless communication technology, however, is to send cumulative data only. Given sufficient precision, an average usage rate may be computed from multiple cumulative data points. Nevertheless, the 3G has a reasonable limitation of transmitting data only to Watt Hour resolution. This is not sufficient to compute usage from measurements received on the frequency required for the subscriber's information and control apparatus.

In order to give timely subscriber feedback, the subscriber's information and control apparatus may make and receive data transmissions on the order of at least about every five (5) seconds. Because the known standard beacon protocols may not be sufficiently precise for real-time use computations, another beacon may be used to transmit both cumulative data, as well as rate information. With respect to electricity, this means kWh and Watts. The subscriber's information and control apparatus may use this data to generate real-time feedback to the subscriber at one (1) Watt resolutions, so that the subscriber may detect the affect of usage changes down to and including low-powered light bulbs.

There are two beacons that may be transmitted by the Intelligent Utility Module (IUM), included in at least one of the utility meters. The IUM is an in electric meter board that converts and ANSI standard meter into a TOU meter. The IUM, when integrated with the 3G RF module may transmit both the standard beacon, a 17 byte fixed length message that carries accumulated data targeted for the Fix Reader wireless network, and the Beacon 7, a 20 byte fixed length message that carried accumulated and rate data targeted for the subscriber's information and control apparatus. Referring to Tables 12 and 13, the following messages provide examples of the standard and Beacon 7 beacons:

TABLE 12

Standard Beacon Protocol
Standard Beacon, Frame Structure 2/3
42 10 4B 99 12 31 0A 00 00 00 00 00 00 A2 70 90 1C

| Byte No. | Field | Size (Bytes) | Description |
|---|---|---|---|
| 0 | Command | 1 | "B" - beacon (a) |
| 1 | Length | 1 | Length + Data Frame + Checksum |
| 2 | FS + Length | 1 | Frame Structure (2, 3) + Length |
| 3-5 | Meter Id | 3 | Meter Id LSB first |
| 6-7 | User Id | 2 | User Id LSB first (not used here) |
| 8-11 | Data | 4 | Measured Data LSB first |
| 12 | Status | 1 | May be used for alarm status |
| 13-15 | RF Status | 3 | For RF Correction |
| 16 | Checksum | 1 | ~(Σ Cbyte) (c) |

TABLE 13

Beacon 7 Protocol
Custom Beacon, Frame Structure 7
42 13 4B 99 12 31 0A 00 00 00 00 00 00 00 00 00 A2 70 90 1C

| Byte No. | Field | Size (Bytes) | Description |
|---|---|---|---|
| 0 | MMR Command | 1 | "B" - beacon (a) |
| 1 | Length | 1 | Length + Data Frame + Checksum |
| 2 | FS + Length | 1 | Frame Structure (7) + Length |
| 3-5 | Meter Id | 3 | Meter Id LSB first |
| 6-7 | User Id | 2 | User Id LSB first (not used here) |
| 8 | 3G Command | 1 | "!" - 21 Hex |
| 9-12 | Summary Data | 4 | Accumulated Data (e.g., kWh) LSB first |
| 13-14 | Real Time Data | 2 | Real-Time Data (e.g., Watts) |
| 15 | Factor + Type | 1 | TTTTFFFF |
| | Factor | 4 (bit) | |
| | Type | 4 (bit) | |
| 16 | Status | 1 | RRRCABWT |
| 17 | Checksum | 1 | ~(Σ Cbyte) (c) |

Preferably, the subscriber's information and control apparatus may be adapted to receive and process 3G beacons in the Beacon 7 protocol, containing accumulate usage (e.g., kWh, gallons, cubic feet) and usage rate (e.g., Watts, gallons/hour, cubic feet/hour) data. Because the protocol described above is for a custom beacon, it is subject to revision and update. The apparatus also may be adapted to receive and process 3G beacons on a frequency of not less than one (1) beacon every five (5) seconds, and to filter out all beacons from meters that the apparatus has not been initialized to manage. Moreover, the subscriber's information and control apparatus may be adapted to receive and process beacon data from one (1) electric meter, one (1) gas meter, and one (1) water meter. Alternatively, the subscriber's information and control apparatus may be adapted to receive and process standard beacon data containing accumulated usage data only. The apparatus may be adapted to receive and process such standard beacon data at a frequency of not less than one (1) beacon per minute.

The subscriber's information and control apparatus also may communicate with an in-meter IUM module in order to set its clock to support variable rate data collection. The apparatus may be adapted to support requests for TOU data from the IUM to support central location data synchronization for data gap filling when data is dropped either through the Fix Network wireless network or in communications from the apparatus to the meter IUM module via GSM (Short Message Service (SMS) or Data over Voice).

The subscriber's information and control apparatus comprises a real-time clock that is used for on screen presentations and for synchronizing with the in-meter IUM module. The real time clock may be set using the Short Message Service Center (SMSC) clock as specified in this example. Referring to Tables 14 and 15, examples of messages, which may be used to set and retrieve the real-time clock reading in the in-meter IUM module, are shown. There are limitations in the 3G with respect to receiving and processing commands. In view of these limitations, and because there is no need to synchronize clocks with less than one minute accuracy, results in the provision of clock set commands only to an accuracy of one (1) minute.

TABLE 14

Set Time Protocol

| Byte No. | Field | Size (Bytes) | Description |
|---|---|---|---|
| 0 | MMR Command | 1 | "B" - beacon (a) |
| 1 | Length | 1 | Length + Data Frame + Checksum |
| 2 | FS + Length | 1 | Frame Structure (7) + Length |
| 3-5 | Meter Id | 3 | Meter Id LSB first |
| 6-7 | User Id | 2 | User Id LSB first (not used here) |
| 8 | 3G Command | 1 | 68 hex ('h') |
| 9-12 | Minutes | 4 | Minutes from Jan. 01, 2000 at Midnight |
| 13 | Factor + Type | 1 | TTTTFFFF |
|  | Factor | 4 (bit) |  |
|  | Type | 4 (bit) |  |
| 14 | Status | 1 | RRRCABWT |
| 15 | Checksum | 1 | ~(Σ Cbyte) (c) |

TABLE 15

Get Time Protocol

| Byte No. | Field | Size (Bytes) | Description |
|---|---|---|---|
| 0 | MMR Command | 1 | "B" - beacon (a) |
| 1 | Length | 1 | Length + Data Frame + Checksum |
| 2 | FS + Length | 1 | Frame Structure (7) + Length |
| 3-5 | Meter Id | 3 | Meter Id LSB first |
| 6-7 | User Id | 2 | User Id LSB first (not used here) |
| 8 | 3G Command | 1 | 48 hex ('H') |
| 9 | Factor + Type | 1 | TTTTFFFF |
|  | Factor | 4 (bit) |  |
|  | Type | 4 (bit) |  |
| 10 | Status | 1 | RRRCABWT |
| 11 | Checksum | 1 | ~(Σ Cbyte) (c) |

The data log is adapted to store data on a defined time frequency. In the in-meter IUM module described above, this frequency is fixed at a predetermined rate. Nevertheless, there is a command for setting the frequency at which data are logged. Referring to Tables 16 and 17, however, the following commands are implemented to support this functionality.

TABLE 16

Set Storage Frequency Protocol

| Byte No. | Field | Size (Bytes) | Description |
|---|---|---|---|
| 0 | MMR Command | 1 | "B" - beacon (a) |
| 1 | Length | 1 | Length + Data Frame + Checksum |
| 2 | FS + Length | 1 | Frame Structure (7) + Length |
| 3-5 | Meter Id | 3 | Meter Id LSB first |
| 6-7 | User Id | 2 | User Id LSB first (not used here) |
| 8 | 3G Command | 1 | 78 hex ('x') |
| 9-10 | Minutes | 2 | Time between reads in 1 minute intervals (default is 15 minutes or Hex 'F' |
| 11 | Factor + Type | 1 | TTTTFFFF |
|  | Factor | 4 (bit) |  |
|  | Type | 4 (bit) |  |
| 12 | Status | 1 | RRRCABWT |
| 13 | Checksum | 1 | ~(Σ Cbyte) (c) |

TABLE 17

Get Storage Frequency Protocol

| Byte No. | Field | Size (Bytes) | Description |
|---|---|---|---|
| 0 | MMR Command | 1 | "B" - beacon (a) |
| 1 | Length | 1 | Length + Data Frame + Checksum |
| 2 | FS + Length | 1 | Frame Structure (7) + Length |
| 3-5 | Meter Id | 3 | Meter Id LSB first |
| 6-7 | User Id | 2 | User Id LSB first (not used here) |
| 8 | 3G Command | 1 | 58 hex ('X') |
| 9 | Factor + Type | 1 | TTTTFFFF |
|  | Factor | 4 (bit) |  |
|  | Type | 4 (bit) |  |
| 10 | Status | 1 | RRRCABWT |
| 11 | Checksum | 1 | ~(Σ Cbyte) (c) |

The protocol for retrieving data from the in-meter IUM module enables the subscriber to specify the time of the last data point or the first data point, or both, to be retrieved, the number of reads, and the time between intervals in minutes. Although in-meter IUM modules, such as those available from Arad Technology Ltd. of Yokneam Elit, Israel, may be configured to store fifteen (15) minute points, the protocol supports greater flexibility. By specifying a known data point from the current time (e.g., time from now until the last read), the interval between reads, and the number of reads; the subscriber may request a single point, all points, or any number of points in between.

The following is an example of a message using the protocol for retrieving data:

Current date: 15/04 12:45

Required data: last read at 15/04 12:00; (Last data point is 45 (Hex 2D) before now 24 reads (18 Hex)

TBR 1 hour/60 minutes (3C Hex)

| Command Payload | | | | | | | |
|---|---|---|---|---|---|---|---|
| Byte | | | | | | | |
| 8 | 9 | 10 | 11 | 12 | 13 | 14 | |
| Value (Hex) | 47 | 2D | 00 | 18 | 00 | 3C | 00 |

TABLE 18

Get Data Log Protocol
42 13 4B 99 12 31 0A 47 2D 00 18 00 3C 00 70 90 1C

| Byte No. | Field | Size (Bytes) | Description |
|---|---|---|---|
| 0 | MMR Command | 1 | "B" - beacon (a) |
| 1 | Length | 1 | Length + Data Frame + Checksum |
| 2 | FS + Length | 1 | Frame Structure (7) + Length |
| 3-5 | Meter Id | 3 | Meter Id LSB first |
| 6-7 | User Id | 2 | User Id LSB first (not used here) |
| 8 | 3G Command | 1 | 58 hex ('G') |
| 9-10 | LSR | 2 | Δt in 1 minute to last read |
| 11-12 | NOR | 2 | Number of Reads |
| 13-14 | TBR | 2 | Time between reads in 1 minute intervals |
| 15 | Factor + Type | 1 | TTTTFFFF |
|  | Factor | 4 (bit) |  |
|  | Type | 4 (bit) |  |
| 16 | Status | 1 | RRRCABWT |
| 17 | Checksum | 1 | ~(Σ Cbyte) (c) |

The amount of data returned from the data log may be significant. Therefore, the returned data may be sent in sequential packets from the in-meter IUM module. The data transmission may be started with a header frame, followed by one or more data frames, and completed with a footer frame. The subscriber's information and control apparatus also may comprise means to set the in-meter IUM module's real-time clock: Date and Time and means to request time sensitive data from the in-meter IUM module. Referring to Tables 19-21, the protocol for each of these frames is specified below.

TABLE 19

Protocol for Header Frame

| Byte No. | Field | Size (Bytes) | Description |
|---|---|---|---|
| 0 | MMR Command | 1 | "B" - beacon (a) |
| 1 | Length | 1 | Length + Data Frame + Checksum |
| 2 | FS + Length | 1 | Frame Structure (7) + Length |
| 3-5 | Meter Id | 3 | Meter Id LSB first |
| 6-7 | User Id | 2 | User Id LSB first (not used here) |
| 8 | Command | 1 | 47 hex ('G') |
| 9-10 | FC | 2 | Frame Counter = 0000 |
| 11-14 | CW base read | 4 | Last clock wise read |
| 15-16 | BDT | 2 | Δt in 1 minute intervals from last stored data. |
| 17-18 | TBR | 2 | Time between stored reads in 1 minute intervals |
| 19 | Factor + Type | 1 | TTTTFFFF |
|  | Factor | 4 (bit) |  |
|  | Type | 4 (bit) |  |
| 20 | Status | 1 | RRRCABWT |
| 21 | Checksum | 1 | ~(Σ Cbyte) (c) |

TABLE 20

Protocol for Data Frame

| Byte No. | Field | Size (Bytes) | Description |
|---|---|---|---|
| 0 | MMR Command | 1 | "B" - beacon (a) |
| 1 | Length | 1 | Length + Data Frame + Checksum |
| 2 | FS + Length | 1 | Frame Structure (7) + Length |
| 3-5 | Meter Id | 3 | Meter Id LSB first |
| 6-7 | User Id | 2 | User Id LSB first (not used here) |
| 8 | Command | 1 | 47 hex ('G') |
| 9-10 | FC | 2 | Frame Counter |
| 11-12 | DR1 | 2 | ΔR from previous Tx |
| 13-14 | DR2 | 2 | ΔR from previous Tx |
| 15-16 | DR3 | 2 | ΔR from previous Tx |
| 17-18 | DR4 | 2 | ΔR from previous Tx |
| 19 | Factor + Type | 1 | TTTTFFFF |
|  | Factor | 4 (bit) |  |
|  | Type | 4 (bit) |  |
| 20 | Status | 1 | RRRCABWT |
| 21 | Checksum | 1 | ~(Σ Cbyte) (c) |

TABLE 21

Protocol for Footer Frame

| Byte No. | Field | Size (Bytes) | Description |
|---|---|---|---|
| 0 | MMR Command | 1 | "B" - beacon (a) |
| 1 | Length | 1 | Length + Data Frame + Checksum |
| 2 | FS + Length | 1 | Frame Structure (7) + Length |
| 3-5 | Meter Id | 3 | Meter Id LSB first |
| 6-7 | User Id | 2 | User Id LSB first (not used here) |
| 8 | Command | 1 | 47 hex ('G') |
| 9-10 | FC | 2 | Frame Counter = FFFF |
| 11-12 | TFC | 2 | Total Frame Count |
| 13 | Factor + Type | 1 | TTTTFFFF |
|  | Factor | 4 (bit) |  |
|  | Type | 4 (bit) |  |
| 14 | Status | 1 | RRRCABWT |
| 15 | Checksum | 1 | ~(Σ Cbyte) (c) |

The central location data management system also is capable of communicating with the subscriber's information and control apparatus for setting rate parameters for utility meters, including electricity, gas, and water meters. The central location data management system also is adapted to schedule the subscriber's information and control apparatus to send its accumulated data on a periodic basis for central location data storage and manipulation. These messages are carried over SMS which provides assured delivery of messages up to a length of 180 ASCII characters.

The subscriber's information and control apparatus is adapted to compute and store accumulated use data in rate bins for low, medium, and high rate periods. This data is used to support TOU, Tiered, and other variable rate structures. In order for the utility commodity central location to compute billing and usage data, it requires these accumulated data to be transmitted to the central location on a periodic basis. This provides a means to send data as an alternative to the Fixed Wireless network. Table 22 defines the parameters necessary to schedule such data transmissions.

TABLE 22

Data Transmission Schedule Protocol

| Position | Field | Size (Char) | Description |
|---|---|---|---|
| 1 | Message Type | 1 | 'S' |
| 2-5 | Start Time | 4 | In minutes since midnight |
| 6 | Interval Type | 1 | D—Days<br>H—Hours<br>N - Minutes |
| 7-9 | No of intervals | 3 | No of 'Interval Type's between messages |
| 10 | Checksum Indicator | 1 | X - indicates that the following |
| 11-12 | Checksum | 2 | Message Checksum |

As examples of the use of this data transmission scheduling protocol, the following are scheduling messages for date transmission. The first example requests that the subscriber's information and control apparatus send data every 3 hours starting at 2 AM:
  S0120H003
The second example requests that the subscriber's information and control apparatus send data every day at 5:30 AM:
  S0330D001

The subscriber's information and control apparatus may receive and respond to such messages for scheduling accumulated data transmissions of electric, gas, water, or other utility commodity data.

The central location data management system also may be adapted to send rate schema definitions to the subscriber's information and control apparatus via GSM or CDMA either through SMS or Data over Voice. Such rate schemas define the type of meter, type of rate (e.g., TOU, Tiered, CPP, or the like), effective dates of the rate schema, and the rate schema parameters. Each rate-type uses the same header, and only the body changes. Each schema represents a single season's rate for a single meter. Up to ten (10) rate schemas (pending and current) can be stored for up to five (5) managed meters or two (2) rate schemas per meter.

For example, each TOU rate schema message represents a single season's rate and includes up to four (4) time periods for low, medium, and high rates. The rate schema is capable of supporting modified rates for Saturdays, Sundays, Holidays, and Pre-Holiday periods. In particular, the rate schema may support up to ten (10) holidays and ten (10) days before holiday. The message protocol for the TOU rate schema, shown below, is a variable length message, with character delimiters and numeric data:

TABLE 23

TOU Rate Schema Protocol

| | Position | Field | Size (Char) | Description/Remark | |
|---|---|---|---|---|---|
| | Q001040004103111123456123456123456W071112173232F081222S191222E00201202203204205<br>2062072082092H003013033033043053063073083095X33 | | | | |
| Schema Header | 1 | Message Type | 1 | 'Q' | |
| | 2-4 | SchemaID | 3 | | |
| | 5-6 | Meter Type | 2 | 00 | Water |
| | | | | 01 | Gas |
| | | | | 02 | Gas Switcher |
| | | | | 03 | Gas Tank |
| | | | | 04 | Electricity |
| | | | | 05 | Alarm |
| | 7-8 | Schema Type | 2 | 00 | TOU |
| | | | | 01 | Tiered |
| | | | | 02 | Critical Peak |
| | | | | 03 | Fixed |
| | 9-10 | Bill Start Day | 2 | 1-31 | |
| | 11-12 | Year | 2 | | |
| | 13-15 | Start Date | 3 | Start date of the schema In days since start of 'Year' | |
| | 16-18 | End Date | 3 | End date of the schema In days since start of 'Year' | |
| | | Total Header size | 18 | | |
| | | Message Structure: | | | |
| General Schedule | 19 | r | 1 | 'R' | |
| | | Rate1 | N | 10 Microcents | |
| | 26 | r | 1 | 'R' | |
| | | Rate2 | N | 10 Microcents | |
| | 33 | r | | 'R' | |
| | | Rate3 | 1 | 10 Microcents | |
| | w | Weekday schedule char. | 1 | 'W' | |
| | w + 1-w + 2 | End hour | 2 | Hour at the end of bellow rate ID. | |
| | w + 3 | Rate ID | 1 | Rate ID ended at 'End Hour' | |
| | | Total weekday schedule size | 3 × N | 36-37 × No. rate changes on week days (N <= 4) | |
| | f | Day before holiday schedule char. | 1 | 'F' | |
| | f + 1-f + 2 | End hour | 2 | Hour at the end of below rate ID. | |

TABLE 23-continued

TOU Rate Schema Protocol

| | Position | Field | Size (Char) | Description/Remark |
|---|---|---|---|---|
| | f + 3 | Rate ID | 1 | Rate ID ended at 'End Hour' |
| | | Total holiday (day before) schedule size | 3 × N | (f + 1-f + 3) × No. rate changes on week days (N <= 4) |
| | s | Holiday schedule char. | 1 | 'S' |
| | s + 1-s + 2 | End hour | 2 | Hour at the end of below rate ID. |
| | s + 3 | Rate ID | 1 | Rate ID ended at 'End Hour' |
| | | Total holiday schedule size | 3 × N | (s + 1-s + 3) × No. rate changes on week days (N <= 4) |
| | | Total schedule size | 30-57 | Includes Rates and Separators |
| Holidays Dates | e | Holidays (days before) dates char. | 1 | 'E' |
| | e + 1-e + 3 | Date of day before holiday | 3 | In number of days since start date. |
| | | Total holidays (day before) dates size | 3 × N | (e + 1-e + 3) × No. of holidays (day before) between start date and end date (N <= 10) |
| | h | Holidays dates char. | 1 | 'H' |
| | h + 1-h + 3 | Date of holiday | 3 | In number of days since start date. |
| | | Total holidays dates size | 3 × N | (h + 1-h + 3) × No. Holidays dates in between start date and end date (N <= 10) |
| | | Total holidays dates Size | 8-62 | Includes Separators |
| | | Checksum Indicator | 1 | 'X' |
| | ??-?? + 1 | Checksum | 2 | See FIG. 18. |
| | | Total Size | 57-138 | Includes Header, Rates, Separators |

Similarly, each Tiered rate schema message represents a single season's rate and includes up to N Tiers. Each tier is represented by the lowest accumulated value for which the rate applies. Because of the extreme variability of the Tiered rate structures for electricity, water, and gas, the number of rate periods that may be supported is defined by the maximum SMS message size. Each rate-period combination is defined by the lowest accumulated value for which the rate applies, and the applicable cost. The start point of the next period defines the end point of the next lower rate period. Moreover, fixed rates may be defined by only including one usage value starting at zero.

For example, each Tiered rate schema message represents a single season's rate. The message protocol for the Tiered rate schema, shown below, is a variable length message, with character delimiters and numeric data and has the same header as for the TOU rate schema message:

TABLE 24

Tiered Rate Schema Protocol

| | Position | Field | Size (Char) | Description/Remark | |
|---|---|---|---|---|---|
| | Q001040111122212C0R0.08058C701R0.13965C1001R0.15668X33 | | | | |
| Schema Header | 1 | Message Type | 1 | 'Q' | |
| | 2-4 | SchemaID | 3 | | |
| | 5-6 | Meter Type | 2 | 00 | Water |
| | | | | 01 | Gas |
| | | | | 02 | Gas Switcher |
| | | | | 03 | Gas Tank |
| | | | | 04 | Electricity |
| | | | | 05 | Alarm |
| | 7-8 | Schema Type | 2 | 00 | TOU |
| | | | | 01 | Tiered |
| | | | | 02 | Critical Peak |
| | | | | 03 | Fixed |
| | 9-10 | Bill Start Day | 2 | 1-31 | |
| | 11-12 | Year | 2 | | |

TABLE 24-continued

Tiered Rate Schema Protocol

| Position | Field | Size (Char) | Description/Remark |
|---|---|---|---|
| 13-15 | Start Date | 3 | Start date of the schema<br>In days since start of 'Year' |
| 16-18 | End Date | 3 | End date of the schema<br>In days since start of 'Year' |
| | Total Header size | 18 | |
| | Message Structure. | | |
| c | Usage char. | 1 | 'C' |
| C + 1 – N | Usage | Variable | Low usage value for which rate applies |
| r | Rate char. | 1 | 'R' |
| R + 1 – N | Rate | Variable | 10 Microcents - Cost per unit that applies to the usage defined between two definitions. Can be used for flat rate. |
| | Checksum Indicator | 1 | 'X' |
| ??-?? + 1 | Checksum | 2 | See FIG. 18. |

Preferably, the central office data management system comprises means to ensure receipt of the rate schema it sends to the subscriber's information and control apparatus. When a subscriber's information and control apparatus receives its rate schema message and has confirmed the data consistency, the apparatus may respond with a message confirmation. For example, for a rate schema message with an identification code 001, intended to subscriber's information and control apparatus with dialog 3G unit identification code 3001232, the confirmation message would be:

TABLE 25

Rate Schema Confirmation Protocol
C03001232Q001

| Position | Field | Size(Char) | Description/Remark |
|---|---|---|---|
| 1 | Confirmation message character | 1 | 'C' |
| 2-9 | 3 g Unit ID | 8 | |
| 10-13 | Confirmed message type and ID | 4 | The first 4 characters of the confirmed message |
| 14 | 1 | Check sum character | 'X' |
| 15-16 | 2 | Check sum | As in all other messages |

The subscriber's information and control apparatus may be adapted to transmit TOU data computed locally to the subscriber's location interface for billing. This provides a backup capability to the Fix Reader wireless network that comprises means for collecting, storing, and forwarding accumulated usage data from a plurality of meters in its coverage area. The message defined below is used to send cumulative use data of up to 9 ASCII digits for low, medium, and high rate periods, for up to four (4) utility meters. Referring to FIG. 18, Modulo 80 is used to transmit this data. The subscriber's information and control apparatus may be adapted to support configurable download times through messages received.

TABLE 26

TOU Summary Data Protocol

| No. | Field | (Char) | Description |
|---|---|---|---|
| 1 | Frame Structure | 1 | '7' |
| 2 | Number of Meters | 1 | |
| 3-6 | EMS Time | 4 | At Reading time. Minutes since Jan. 01, 2001 |
| | Total Header Size | 6 | |
| 7-9 | Municipal (user) code | 3 | |
| 10-13 | Meter ID | 4 | |
| 14-18 | Total Active Energy | 5 | |
| 19-23 | Total Low Rate | 5 | |
| 24-28 | Total Mid Rate | 5 | |
| 29-33 | Total High Rate | 5 | |
| 34 | Status | 1 | |
| 35 | Factor | 1 | |
| 36 | Type | 1 | |
| | Total Meter Data Size | 30 × N | 7-36 × No of meters (N <= 4) |
| ??-??+1 | checksum | 2 | See FIG. 19 |
| | Total Message Size | 38-128 | |

Figure 16:
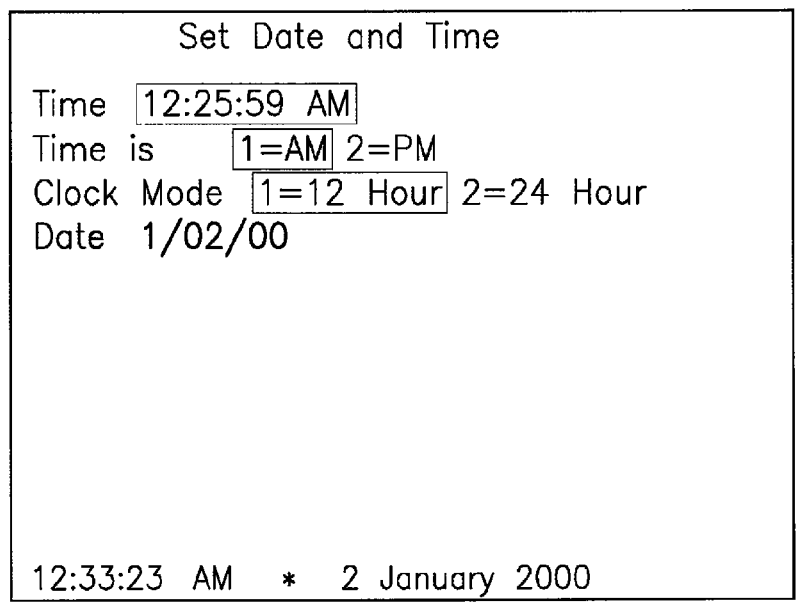
FIG. 16 depicts a subscriber's clock set dialog, screen display on the information and control apparatus, as depicted in FIG. 7.

The subscriber's information and control apparatus comprises means to set its internal clock during installation and prior to service turn on. Preferably, the clock may be set by the network via SMS after installation, as shown in FIG. 16. The subscriber's information and control apparatus also may comprise means to update its clock, and, subsequently, the clock in the in-meter IUM module, to support TOU utility commodity services. An updated clock is necessary for management of TOU data, for demand side management in the subscriber's information and control apparatus, and for long term collection of TOU data for TOU billing in the subscriber's location interface.

Known cellular modems comprise means to set and retrieve times from their internal clocks, but these clocks are not synchronized with the network without an external service. The subscriber's information and control apparatus may take advantage of SMS to set its clock independent of other subscriber's information and control apparatus. Referring to FIG. 17, when an SMS message is sent, it is initially received by the SMSC. This message is time tagged on receipt. The subscriber's information and control apparatus may use this time tag to set its real-time clock. The subscriber's information and control apparatus also may send an SMS message to itself on a periodic basis. When the subscriber's information and control apparatus sends such a message, the apparatus may start an internal timer that may be used to set its clock by using the time in the message that it generated and an offset from the internal timer value. This may ensure clock accuracy within tolerances necessary to support TOU utility commodity services.

The in-meter IUM module also comprises means to set its clock in order to support TOU data collection. Once the clock is set on the subscriber's information and control apparatus, the apparatus will send a message to the in-meter IUM module to set its clock. Preferably, the clocks in the in-meter IUM module and the subscriber's information and control apparatus are synchronized with the fixed wireless network. The subscriber's information and control apparatus, as stated previously, may use the SMSC clock to set its time and, subsequently, may set the clock in the in-meter IUM module, according to the protocol set forth in Table 27. The in-meter IUM module is configured to echo back the same command to the subscriber's information and control apparatus to confirm receipt of this time setting message.

TABLE 27

IUM Clock Set Protocol

| No. | Field | (Bytes) | Description |
|---|---|---|---|
| 1 | Command | 1 | |
| 2 | DateTime | 4 | Minutes Since 1 Jan. 2000 (TBD) |

In addition to providing subscribers with up to date billing information to manage in utility commodity usage, the subscriber's information and control apparatus may be adapted to support pre-payment of utility commodity costs and content download and to develop subscriber loyalty through merchant credit delivery. These are additional services that may enhance the utility commodity supplier's basic utility commodity service delivery business model and create new revenue generation conduits. The subscriber's information and control apparatus enables these additional services by the inclusion of a smart card reader in or in operational communication with the apparatus. Suitable smart cards may receive downloads of digital money or utility commodity value coupons, which may be used to pre-purchase energy credits. Preferably, the smart card may be an integrated circuit card with a credit card format (ISO 7813). Alternatively, such smart cards may receive downloads of merchant credits for use at local merchants, or both.

The in-meter IUM module is a wireless data collection, storage, and transmission module housed within an electric meter, in particular, to enhance the capabilities of ANSI standard and non-standard residential meters (e.g., a Landis+Gyr focus meter, available from Landis+Gyr Inc., of Lafayette, Ind.). The in-meter IUM module collects data for variable rate billing for electricity usage data, local aggregation of water and gas usage data, real-time transmission of usage data to the subscriber's information and control apparatus in a local utility commodity management system and transmission to the utility commodity central location for billing. In particular, the in-meter IUM module may perform the following functions within the claimed system: near real-time data collection and transmission, local data storage for billing reconciliation, local data collection of electric, gas, water, and other utility commodity data, subscriber location LAN transmission through building walls, and WAN transmission beyond subscriber location to support next generation AMR.

More specifically, the in-meter IUM module may provide a wireless interface to support low cost installation, as well as transmission of critical use data to both the subscriber for local utility commodity management and to utility commodity suppliers to support enhanced AMR capabilities including variable rate billing. In addition, the in-meter IUM module may provide an open interface to support collection of utility commodity usage data from ANSI standard meters, as well as other standard and non-standard digital metering technology. Further, the in-meter IUM module preferably comprises an on-board, non-volatile RAM, having sufficient storage capacity to store enough usage data (e.g., 15 minute intervals over the billing period) to support electric, gas, water, and other utility commodities for TOU billing. Moreover, the in-meter IUM module may comprise a bi-directional interface to the supported utility meter for communications to and from the subscriber's information and control apparatus and from wireless, gas and water meters.

The in-meter IUM module in association with the subscriber's information and control apparatus, the Fix Reader wireless network, and central location data management system provides a myriad of capabilities including data collection and presentation, budget and usage management, threshold alarm generation, and subscriber location automation. Although this combination of components provide both demand side management and next generation AMR capabilities, this example focuses specifically on the in-meter IUM module as an enabling technology for this comprehensive system.

The in-meter IUM module is a combined, hardware and firmware interface between the utility commodity supplier and the utility meter. The module comprises a microprocessor, a memory (e.g., a non-volatile, random access memory (RAM)), and a communication link (e.g., a radio-frequency transceiver and antenna). In addition, the module may comprise an RS-485 interface converter, which provides async, point-to-point operation for 2-wire, half-duplex applications and derives its power from RS-232 data and control signals and transmits and receives data in each direction. The in-meter IUM module may achieve async, point-to-point operation for 2-wire, half-duplex applications. The in-meter IUM module is adapted to collect usage data from a utility meter or meters and, in particular, from an electricity meter in which it may be housed, in order to support variable rate pricing (e.g., TOU, Tiered, CPP, and the like). The module also may act as a communications gateway between utility commodity central locations, and the display of the subscriber's information and control apparatus for downloading rate schema data, prepayment requests, merchant credits, and other information of interest to the subscriber. The module also may act as a collector for remotely placed water and gas meters that are equipped with the same RF technology as in the electricity meter and subscriber's information and control apparatus.

The in-meter IUM module may be adapted to communicate with an ANSI standard electricity meter or with configurable, non-standard meters, or both, in order to collect real-time and accumulated utility commodity usage data. This is a primary, but not the sole functionality performed by the in-meter IUM module. As noted above, the module also may act as a gateway for collecting water, gas, and other utility commodity data. In addition, the in-meter IUM module my transmit accumulated data to a fixed wireless network and to a mobile (e.g., handheld) apparatus for billing determination or payment, or both. The fixed wireless network may be adapted to serve as a collector and concentrator of usage data from the in-meter IUM module, as well as from other utility commodity meters. Moreover as noted above, the module may comprise an RF interface to communicate with the Fix Reader wireless network, and a MMR data collector. Data collected by the Fix Reader wireless network may be stored and forwarded to the data management software at the utility commodity central locations in order to support variable rate billing (e.g., TOU, Tiered, CPP, and the like). The in-meter IUM module is distinguishable over known in-meter AMR modules by the in-meter IUM module's ability to communicate with the subscriber's information and control apparatus. The in-meter IUM transmits both instantaneous usage (e.g., Watts, gallons/hour, cubic feet/hour) and accumulated usage (e.g., kWh, gallons, cubic feet) data for display at the subscriber's information and control apparatus, as depicted in FIGS. 11-13. In addition, unlike known in-meter AMR modules, the in-meter IUM module is adapted to receive rate schema data from the utility commodity central locations and forward it to the subscriber's information and control apparatus. This rate schema data may be used by the subscriber's information and control apparatus to compute usage information into monetary units for the subscriber, as depicted in FIGS. 10-15.

In a preferred embodiment, the in-meter IUM modules is housed within an industry standard electricity meter, such as a Landis+Gyr Focus residential digital electricity meter. Although the module may be configured to be powered by the same power source powering the meter, the module may further comprise a backup or alternative power source (e.g., a battery, capacitor, or connection to an emergency generator) to ensure that data stored in the modules memory is retained in the event of a power loss or interruption. The memory of the in-meter IUM module may retain up to at least forty (40) days, and preferably, at least about forty-five (45) days, and still more preferably, at least about sixty (60) days, of fifteen (15) minute interval data for electricity, water, gas, and other utility commodity usage data. Alternatively, this data may be stored at the subscriber's location in a memory disposed in the subscriber's information and control apparatus, in a subscriber's computer, or at another subscriber's location memory. The in-meter IUM module also may comprise a tilt indicator to detect potential tampering or other damage.

Preferably, the 3G board and the IUM board may be integrated into the Landis+Gyr Focus residential digital electricity meter casing in the space defined in the Focus meter specifications. The in-meter IUM RF device may be separate from, but preferredly is integrated into the 3G RF unit, such as the 3G RF unit, available from Arad Technologies Ltd. As noted above, this is a bidirectional RF device that communicates to and from the Fix Reader wireless network, handheld and mobile/drive-by units, and the subscriber's information and control apparatus. The in-meter IUM module powers the RF device and provides it with sufficient range to satisfy predetermined data collection and transmission parameters. For example, in a preferred embodiment, the IUM RF device may have an effective transmission range of about 305 meters to the Fix Reader wireless network and to a mobile/drive-by meter reader and of about 305 meters to the subscriber's information and control apparatus. Conversely, the IUM RF device may have an effective reception range of about 46 meters from the subscriber's information and control apparatus in order to receive and respond to remote connect and disconnect signals for utility commodity services, clock set, and other remotely originating commands to the in-meter IUM module.

It is further preferred that the in-meter IUM module supplies DC power in a range of about 3.3 to about 3.8 VDC and about five (5) mA continuous and about sixty (60) mA peak current for fifteen (15) ms to the IUM RF device, as depicted in FIG. 3. The in-meter IUM module controls switches to regulate and isolates the meter's main power supply in response to remotely generated signals or predetermined thresholds. In addition, the in-meter IUM module further may comprise a 3.3-3.8 V level a Universal Asynchronous Receiver/Transmitter (UART)) data interface to the IUM RF device. A UART is the microchip with known programming that controls the module's interface to the device. Specifically, the UART provides the module with a RS-232C Data Terminal Equipment (DTE) interface, so that the module may communicate with the device and exchange data with the device. The in-meter IUM module further may comprise a power reset for the IUM RF device to facilitate recovery after any power interruption or loss. The in-meter IUM module may communicate with the IUM RF device through a UART with the following interface parameters: 3.3 logic levels, Tx, Rx, GND pins, 4.8 k baud, no parity bit, and each byte having logic '0' start bit, logic '1' one stop bit.

If the in-meter IUM module and the IUM RF device are not disposed on a single board, the IUM RF device may be adapted to act as a client to the in-meter IUM module. The IUM RF device has several set/get commands that may be transmitted to the IUM UART in order to retrieve or obtain data. The IUM RF device is configured to retrieve or obtain data from the in-meter IUM module on a periodic basis (e.g., not less than once every five (5) seconds). The IUM RF module also may be adapted to support other commands, such as clock set and TOU data requests. For example, when collecting data from a standard beacon, the IUM RF device may periodically request current and accumulated usage data. In an embodiment, the target of these data requests is the Fix Reader wireless network, and the request may be a Hex 57 with a two (2) second timeout. Referring to Tables 28 and 29, when such a request is made, the in-meter IUM modules accepts data collected from a utility meter and returns the following commands:

TABLE 28

IUM to RF Standard Beacon Data Request Protocol

| No. | Field | (Bytes) | Description |
|---|---|---|---|
| 1 | Command | 1 | "W" - Hex 57 |

TABLE 29

IUM to RF Standard Beacon Data Response Protocol

| No. | Field | (Bytes) | Description |
|---|---|---|---|
| 1 | Command | 1 | "W" - Hex 57 |
| 2 | Accumulated Wh | 4 | Returns the electricity use in Watt Hours |

When collecting data from a Beacon 7, the IUM RF device again periodically requests current real-time and accumulated usage data. The target of these data requests, however, may be the subscriber's information and control apparatus. The request again is a Hex signal with a two (2) second timeout. Referring to Tables 30 and 31, when such a request is made, the in-meter IUM module accepts data collected from a utility meter and returns the following commands:

TABLE 30

IUM to RF Beacon 7 Data Request Protocol

| No. | Field | (Bytes) | Description |
|---|---|---|---|
| 1 | Command | 1 | "!" - 21 Hex |

TABLE 31

IUM to RF Beacon 7 Data Response Protocol

| No. | Field | (Bytes) | Description |
|---|---|---|---|
| 1 | Command | 1 | "!" - 21 Hex |
| 2-5 | Summary Data | 4 | Accumulated Data (e.g., kWh) LSB first |
| 6-7 | Real Time Data | 2 | Real-Time Data (e.g., Watts) |

The in-meter IUM module comprises a real time clock in order to support TOU data collection. As described above, the IUM clock may be set using an external device, such as the subscriber's information and control apparatus. The subscriber's information and control apparatus sends a Hex command and a Hex representation of Minutes since 1 Jan. 2000. The IUM echoes back the time once its clock is set. Referring to Tables 32-34, the set time and get time commands are described below.

TABLE 32

Time Set Command Protocol

| No. | Field | (Bytes) | Description |
|---|---|---|---|
| 1 | Command | 1 | "h"—Hex 68 |
| 2 | DateTime | 4 | Minutes Since 1 Jan 2000 at midnight |

TABLE 33

Get Time Command Protocol

| No. | Field | (Bytes) | Description |
|---|---|---|---|
| 1 | Command | 1 | "H"—Hex 48 |

TABLE 34

Get Time Command Response Protocol

| No. | Field | (Bytes) | Description |
|---|---|---|---|
| 1 | Command | 1 | "H"—Hex 48 |
| 2 | DateTime | 4 | Minutes Since 1 Jan 2000 at midnight |

The data log is capable of storing data on a defined time frequency or Set/Get Log Read Interval. In the in-meter IUM modules, this frequency may be fixed. Nevertheless, the frequency may be varied by a command for setting the frequency at which data is logged. Referring to Tables 35-37, the following commands may be implemented to support this functionality, including setting the frequency and retrieving the current frequency:

TABLE 35

Set Storage Frequency Protocol

| Byte No. | Field | Size (Bytes) | Description |
|---|---|---|---|
| 1 | Command | 1 | 78 hex ('x') |
| 2-3 | Minutes | 2 | Time between reads in 1 minute intervals (default is 15 minutes or Hex 'F' |

TABLE 36

Get Storage Frequency Protocol

| Byte No. | Field | Size (Bytes) | Description |
|---|---|---|---|
| 1 | 3G Command | 1 | 58 hex ('X') |

TABLE 37

Get Storage Frequency Response Protocol

| Byte No. | Field | Size (Bytes) | Description |
|---|---|---|---|
| 1 | Command | 1 | 78 hex ('x') |
| 2-3 | Minutes | 2 | Time between reads in 1 minute intervals (default is 15 minutes or Hex 'F' |

Similarly, the in-meter IUM module logs data periodically. Although the interval may be selectable, the data log retains accumulated usage data on a default periodic interval of fifteen (15) minutes. Nevertheless, referring to Table 38, when a data log request is received from the 3G wireless communication system by the IUM RF interface (e.g., the UART), the following commands may be implemented to support this functionality, including setting the periodic interval:

TABLE 38

Get Data Log Request Protocol

| Byte No. | Field | Size (Bytes) | Description |
|---|---|---|---|
| 1 | 3G Command | 1 | 58 hex ('G') |
| 2-3 | LSR | 2 | At in 1 minute to last read |
| 4-5 | NOR | 2 | Number of Reads |
| 6-7 | TBR | 2 | Time between reads in 1 minute intervals |

The number of records that may be returned from the data log request of Table 38 may be significant. For example, for a single utility meter, the data log request may return several hundred points of data. Referring to Tables 39-41, the protocol for the format, in which such a data log is provided, is defined by three frame formats: header, data, and footer. Specifically, when the 3G wireless communication system makes a request as shown in Table 38, the following frames may be returned.

TABLE 39

Get Data Log Response Header Protocol

| Byte No. | Field | Size (Bytes) | Description |
|---|---|---|---|
| 1 | Command | 1 | 47 hex ('G') |
| 2-3 | FC | 2 | Frame Counter |
| 4-7 | CW base read | 4 | Last clock wise read |
| 8-9 | BDT | 2 | Δt in 1 minute intervals from last stored data. |
| 10-11 | TBR | 2 | Time between stored reads in 1 minute intervals |

TABLE 40

Get Data Log Response Data Protocol

| Byte No. | Field | Size (Bytes) | Description |
|---|---|---|---|
| 1 | Command | 1 | 47 hex ('G') |
| 2-3 | FC | 2 | Frame Counter |
| 4-5 | DR1 | 2 | ΔR from previous Tx |
| 6-7 | DR2 | 2 | ΔR from previous Tx |
| 8-9 | DR3 | 2 | ΔR from previous Tx |
| 10-11 | DR3 | 2 | ΔR from previous Tx |

TABLE 41

Get Data Log Response Footer Protocol

| Byte No. | Field | Size (Bytes) | Description |
|---|---|---|---|
| 1 | Command | 1 | 47 hex ('G') |
| 2-3 | FC | 2 | Frame Counter = FFFF |
| 3-4 | TFC | 2 | Total Frame Count |

A distinguishing function of the in-meter IUM module, aside from its ability to transmit data to the subscriber's information and control apparatus, is that the in-meter IUM module is adapted to provide real-time usage data, as well as, cumulative usage data to the subscriber's information and control apparatus periodically and at frequencies below one (1) transmission per ten (10) seconds. These data are used to compute and present usage information to the subscriber in monetary units. The in-meter IUM module also is adapted to transmit usage data for electricity and may optionally transmit usage data for water, gas, and other utility commodities, if these data are not themselves transmitted directly from the various meters to the subscriber's information and control apparatus. The in-meter IUM module, therefore, is adapted to transmit beacons containing real-time and accumulated usage data to the subscriber's information and control apparatus according to pre-defined periods using the custom beacon protocol shown below with reference to Tables 42 and 43. In particular, the protocol for a custom beacon, frame structure 7 may be as follows:

TABLE 42

Beacon 7 Protocol
42 13 4B 99 12 31 0A 00 00 00 00 00 00 00 00 A2 70 90 1C

| Byte No. | Field | Size (Bytes) | Description |
|---|---|---|---|
| 0 | MMR Command | 1 | "B"—beacon (a) |

TABLE 42-continued

Beacon 7 Protocol
42 13 4B 99 12 31 0A 00 00 00 00 00 00 00 00 A2 70 90 1C

| Byte No. | Field | Size (Bytes) | Description |
|---|---|---|---|
| 1 | Length | 1 | Length + Data Frame + Checksum |
| 2 | FS+Length | 1 | Frame Structure (7) + Length |
| 3-5 | Meter Id | 3 | Meter Id LSB first |
| 6-7 | User Id | 2 | User Id LSB first (not used here) |
| 8 | 3G Command | 1 | "!" - 21 Hex |
| 9-12 | Summary Data | 4 | Accumulated Data (e.g., kWh) LSB first |
| 13-14 | Real Time Data | 2 | Real-Time Data (e.g., Watts) |
| 15 | Factor + Type | 1 | TTTTFFFF |
|  | Factor | 4 (bit) |  |
|  | Type | 4 (bit) |  |
| 16 | Status | 1 | RRRCABWT |
| 17 | Checksum | 1 | ~(Σ Cbyte) (c) | and the protocol for a standard beacon, frame structure 2/3 may be as follows:

TABLE 43

Standard Beacon Protocol
42 10 4B 99 12 31 0A 00 00 00 00 00 00 A2 70 90 1C

| Byte No. | Field | Size (Bytes) | Description |
|---|---|---|---|
| 0 | Command | 1 | "B"—beacon (a) |
| 1 | Length | 1 | Length + Data Frame + Checksum |
| 2 | FS + Length | 1 | Frame Structure(2, 3) + Length |
| 3-5 | Meter ID | 3 | Meter Id LSB first |
| 6-7 | User ID | 2 | User Id LSB first (not used here) |
| 8-11 | Data | 4 | Measured Data LSB first |
| 12 | Status | 1 | May be used for alarm status (TBD) |
| 13-15 | RF Status | 3 | For RF Correction |
| 16 | Checksum | 1 | ~(Σ Cbyte) (c) |

In a preferred embodiment, the in-meter IUM module is adapted to operate in communication with a Fix Reader wireless network. This RF network comprises a data repeater and collector nodes that transport data from in-meter IUM modules to data management software disposed at utility commodity central locations. The in-meter IUM module is adapted to send beacons with accumulated usage data to the Fix Reader wireless network according to pre-defined periods using the standard beacon protocol shown in Table 43. As discussed above, the in-meter IUM module also is adapted to receive commands from the subscriber's information and control apparatus or data management software disposed at utility commodity central locations, or both. The most prominent of such commands may be those for setting the time in the IUM clock for supporting TOU data collection and for requesting the delivery of the log data from the in-meter IUM module.

As noted above, the in-meter IUM module may comprise a tilt sensor to report potential tampering with or damage to the IUM module or the meter housing the IUM module, or both. The in-meter IUM module is adapted to log or transmit, or both, a tilt indication exceeding a predetermined amount to the subscriber's information and control apparatus or to data management software disposed at utility commodity central locations, or both, via the fixed wireless network. Because the in-meter IUM module may lose power or experience a power interruption during tampering, the module is adapted to receive power for a sufficient period (e.g., for at least about five (5) seconds) from a back-up or alternative power source or sources to transmit a beacon with the tamper indication flag set. For example, the tamper indicator may be initiated by tilting (e.g., by at least about fifteen (15) degrees from the vertical for at least about five (5) seconds) the module or the meter, or both, which, in turn, may generates an event in the microprocessor, which logs the indication and time in the memory, and sends a beacon targeting the Fix Reader wireless network. The tamper flag may indicate that tampering may have occurred and may be reset either internally or externally when power is restored and the module or meter is no longer tilted.

Thus, the in-meter IUM module is a module housed within a utility meter (e.g., an electricity meter) adapted to collect, store, retrieve, and transmit data. The IUM module may be adapted to interface to the Fix Reader wireless network, MMR, and drive-by meter reading systems. The IUM module also is adapted to interface with the subscriber's information and control apparatus. The IUM module may convert a standard utility meter into a TOU meter, while providing gateway functionality between data management software disposed at utility commodity central locations and the subscriber's information and control apparatus. The foregoing example describes functionalities for a reduced cost, in-meter IUM module.

Other embodiments of the invention will be apparent to the skilled in the art from consideration of this specification or practice of the invention disclosed herein. It is intended that the specification and the foregoing examples be considered as exemplary only. Although embodiments of the present invention have been described in detail herein, the scope of the invention is not limited thereto. It will be appreciated by those skilled in the art that various modifications may be made without departing from the scope of the invention. Accordingly, the embodiments disclosed herein are only exemplary. It is to be understood that the scope of the invention is not to be limited thereby, but is to be determined by the claims which follow.

What we claim is:

1. A system for displaying utility commodity cost and usage data at a subscriber's location and for local or remote control of utility commodity usage; the system comprising:
   at least one meter for measuring usage of at least one utility commodity and generating at least one usage signal comprising a measurement of said subscriber's usage of said at least one utility commodity;
   at least one central location for receiving said subscriber's utility commodity usage data and a utility commodity cost for said subscriber and transmitting at least one utility commodity rate signal or at least one utility commodity usage control signal, or both, to an information and control apparatus at the subscriber's location;
   said information and control apparatus comprising: a display microprocessor; a memory; a display; a user interface; a display clock; and a display communication device for receiving utility commodity rates and utility control signals from said at least one central location, for receiving at least one usage signal from said at least one meter, and for transmitting said subscriber's utility commodity usage data to said at least one central location;
   a control system interface apparatus comprising:
   an interface memory for storing utility data received from at least one meter, said meter generating at least one usage signal comprising a measurement of a subscriber's usage of at least one utility commodity;
   an interface communication device for receiving at least one usage signal from said at least one meter; and
   an interface microprocessor comprising an interface clock, which is linked to said interface memory and which determines time interval usage data for said at least one utility commodity calculated from said measurement received in said at least one usage signal for said at least one utility commodity received from said at least one meter and transmits said time interval usage data for storage in said interface memory; and
   a remote computer comprising a remote communication device for transmitting signals to said control system interface apparatus requesting download of said time interval usage data and to receive said time interval usage data transmitted by said interface communication device,
   wherein each of said at least one meter further comprises a meter communication device for transmitting at least one usage signal to said information and control apparatus and
   wherein each of said at least one central locations further comprises a center communication device for transmitting utility commodity rate signals or utility commodity usage control signals to said information and control apparatus and for receiving said subscriber's utility commodity usage data from said information and control apparatus.

2. The system of claim 1, wherein said at least one meter measures usage of at least three utility commodities.

3. The system of claim 2, wherein said time interval for said time interval usage data is at least about fifteen minutes.

4. The system of claim 3, wherein said interface memory has sufficient capacity to store said time interval usage data for at least about forty days.

5. The system of claim 1, further comprising a local area network operably connected to said interface communication device.

6. The system of claim 5, further comprising at least one switching device operably connected to said interface communication device, and control signals generated by said interface microprocessor are transmitted to said at least one switching device by said interface communications device via said local area network.

7. The system of claim 6, wherein said at least meter comprises an electrical meter and said at least one switching device modulates a flow of electricity to at least one electrical load.

8. The system of claim 6, further comprising at least one subscriber utility supply controller operably connected to said interface communication device via said local area network, whereby said at least one subscriber utility supply controller modulates the supply of at least one utility commodity to said subscriber.

9. A system for displaying utility commodity cost and usage data at a subscriber's location and for local or remote control of utility commodity usage, the system comprising:
   at least one meter for measuring usage of at least one utility commodity and generating at least one usage signal comprising a measurement of said subscriber's usage of said at least one utility commodity;
   at least one central location for receiving said subscriber's utility commodity usage data and a utility commodity cost for said subscriber and transmitting at least one utility commodity rate signal or at least one utility commodity usage control signal, or both, to an information and control apparatus at the subscriber's location;

said information and control apparatus comprising: a display microprocessor; a memory; a display; a user interface; a display clock; and display communication means for receiving utility commodity rates and utility control signals from said at least one central location, for receiving at least one usage signal from said at least one meter, and for transmitting said subscriber's utility commodity usage data to said at least one central location;

a control system interface apparatus comprising:
  an interface memory for storing utility data received from at least one meter, said meter generating at least one usage signal comprising a measurement of a subscriber's usage of at least one utility commodity;
  interface communication means for receiving at least one usage signal from said at least one meter; and
  an interface microprocessor comprising an interface clock, which is linked to said interface memory and which determines time interval usage data for said at least one utility commodity calculated from said measurement received in said at least one usage signal for said at least one utility commodity received from said at least one meter and transmits said time interval usage data for storage in said interface memory; and a remote computer comprising remote communication means for transmitting signals to said control system interface apparatus requesting download of said time interval usage data and to receive said time interval usage data transmitted by said interface communication means, wherein each of said at least one meter further comprises meter communication means for transmitting at least one usage signal to said information and control apparatus and wherein each of said at least one central locations further comprises center communication device for transmitting utility commodity rate signals or utility commodity usage control signals to said information and control apparatus and for receiving said subscriber's utility commodity usage data from said information and control apparatus.

\* \* \* \* \*